(12) United States Patent
Oh et al.

(10) Patent No.: US 7,816,725 B2
(45) Date of Patent: Oct. 19, 2010

(54) SEMICONDUCTOR DEVICES AND METHODS OF FABRICATING THE SAME

(75) Inventors: Chang-Woo Oh, Suwon-si (KR);
Sung-Hwan Kim, Suwon-si (KR);
Dong-Gun Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 861 days.

(21) Appl. No.: 11/633,403

(22) Filed: Dec. 4, 2006

(65) Prior Publication Data
US 2007/0128779 A1   Jun. 7, 2007

(30) Foreign Application Priority Data
Dec. 6, 2005   (KR) ...................... 10-2005-0118325

(51) Int. Cl.
*H01L 29/792* (2006.01)
(52) U.S. Cl. .............................. 257/324; 257/E21.679; 257/E29.309
(58) Field of Classification Search .................. 257/324, 257/E21.679, E29.309
See application file for complete search history.

(56) References Cited

U.S. PATENT DOCUMENTS

| 6,337,497 | B1 | 1/2002 | Hanafi et al. |
| 6,583,440 | B2 | 6/2003 | Yasukawa |
| 6,818,921 | B2 | 11/2004 | Yasukawa |
| 6,861,320 | B1* | 3/2005 | Usenko ...................... 438/305 |
| 6,903,420 | B2 | 6/2005 | Wang |
| 7,112,514 | B2 | 9/2006 | Yasukawa |
| 2002/0110018 | A1* | 8/2002 | Ohsawa ...................... 365/149 |
| 2004/0007734 | A1* | 1/2004 | Kato et al. .................. 257/324 |
| 2004/0135194 | A1* | 7/2004 | Lee ............................ 257/315 |
| 2004/0137686 | A1* | 7/2004 | Chen et al. .................. 438/287 |
| 2004/0217434 | A1 | 11/2004 | Lee et al. |
| 2008/0087941 | A1* | 4/2008 | Yun et al. ................... 257/324 |
| 2008/0093664 | A1* | 4/2008 | Yun et al. ................... 257/324 |
| 2008/0096351 | A1* | 4/2008 | Kim et al. .................. 438/257 |
| 2009/0221140 | A1* | 9/2009 | Lim et al. ................... 438/591 |

FOREIGN PATENT DOCUMENTS

| JP | 8-316337 A | 11/1996 |
| JP | 10-326879 | 12/1998 |
| JP | 2002-170942 | 6/2002 |
| JP | 2004-336052 | 11/2004 |
| JP | 2005-51186 A | 2/2005 |
| KR | 10-0297456 | 5/2001 |
| KR | 10-2004-0094498 | 11/2004 |
| KR | 10-0475502 | 3/2005 |

* cited by examiner

*Primary Examiner*—Benjamin P Sandvik
(74) *Attorney, Agent, or Firm*—Mills & Onello, LLP

(57) ABSTRACT

Exposed are a semiconductor device and method of fabricating the same. The device includes an insulation film that is disposed between an active pattern and a substrate, which provides various improvements. This structure enhances the efficiency of high integration and offers an advanced structure for semiconductor devices.

18 Claims, 19 Drawing Sheets

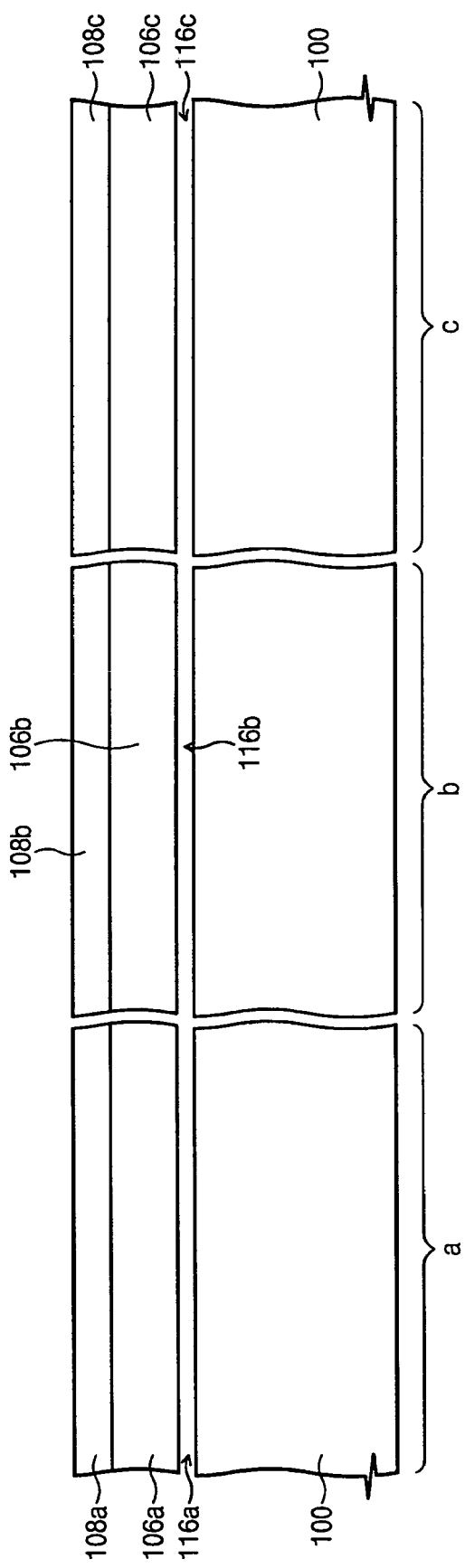

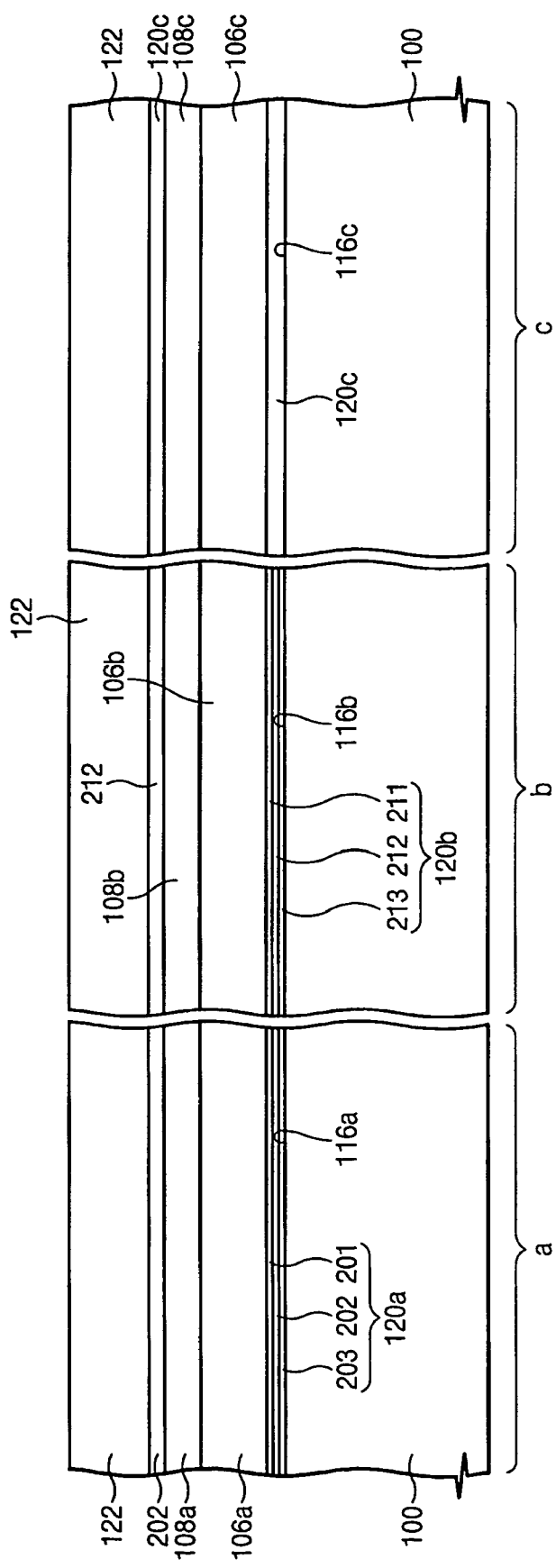

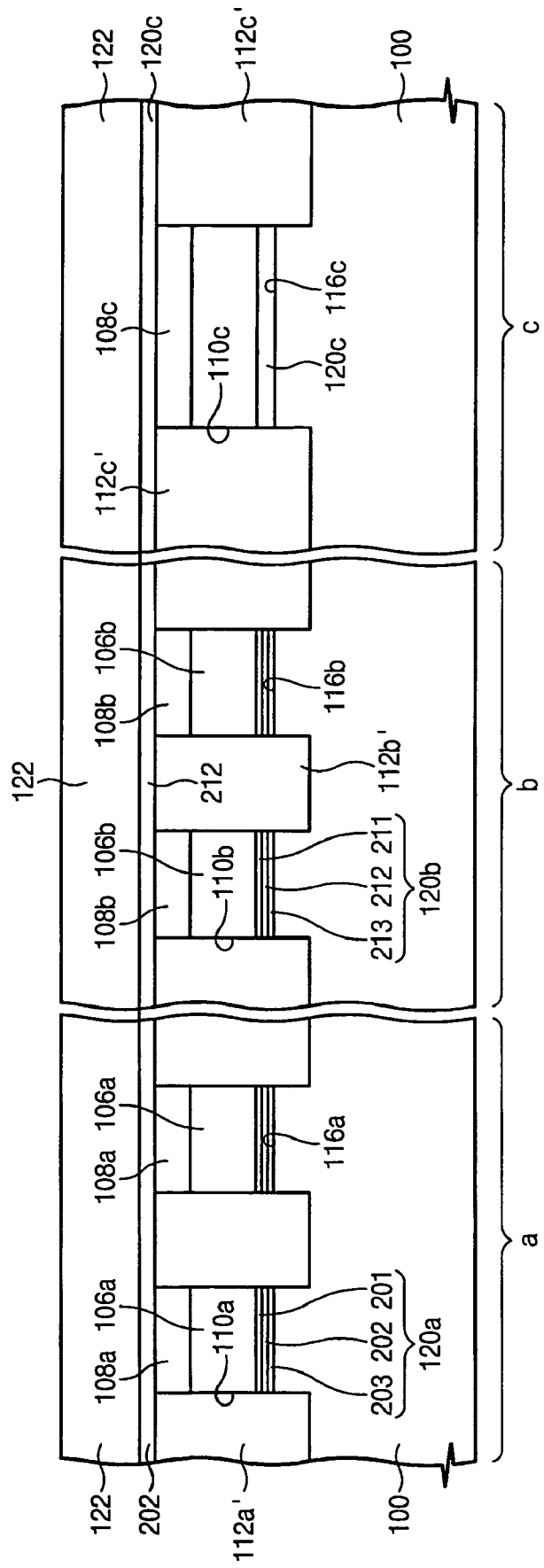

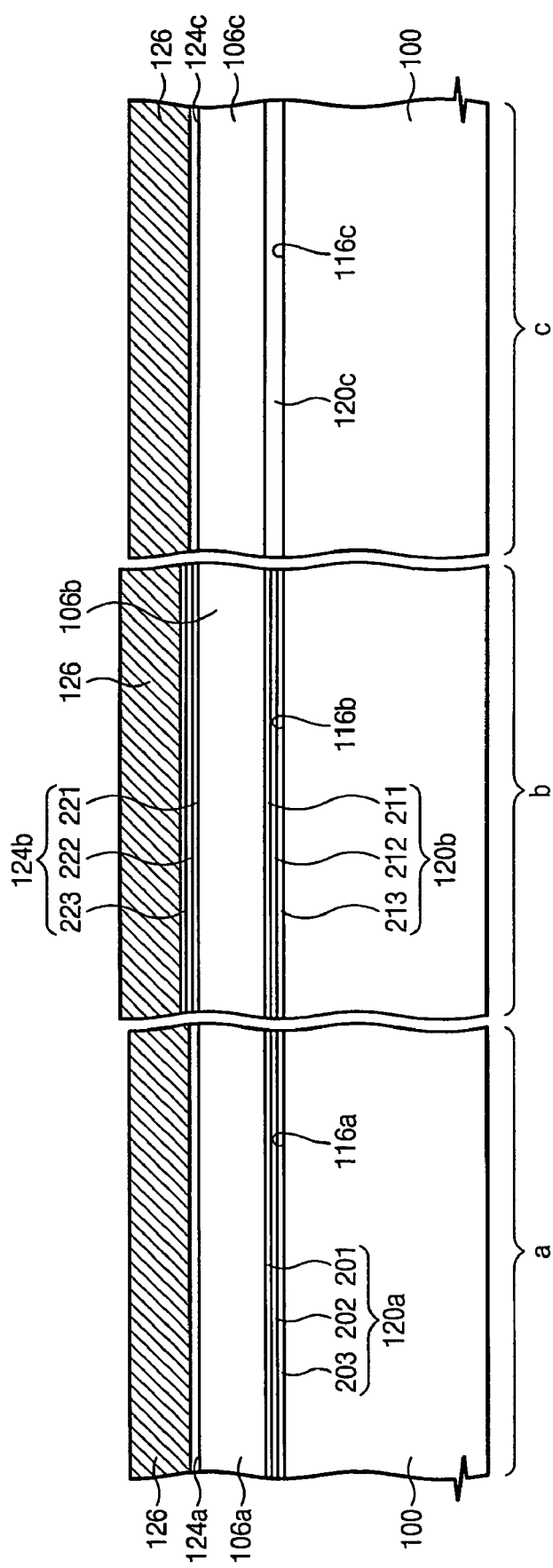

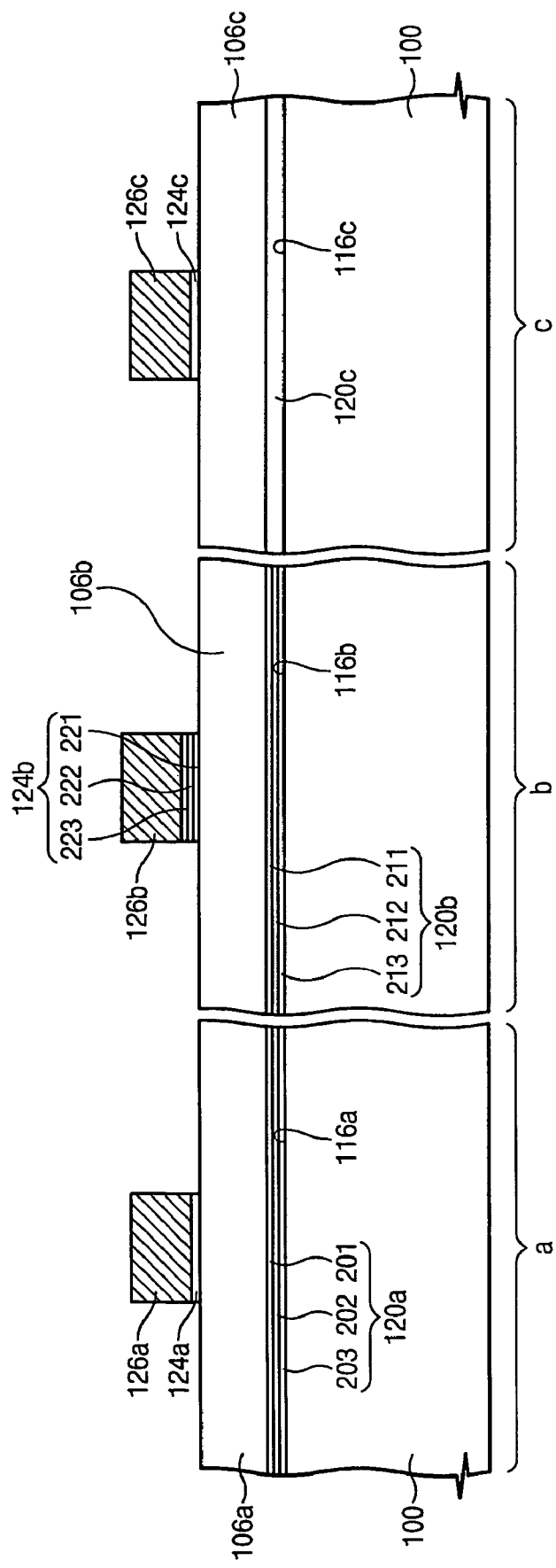

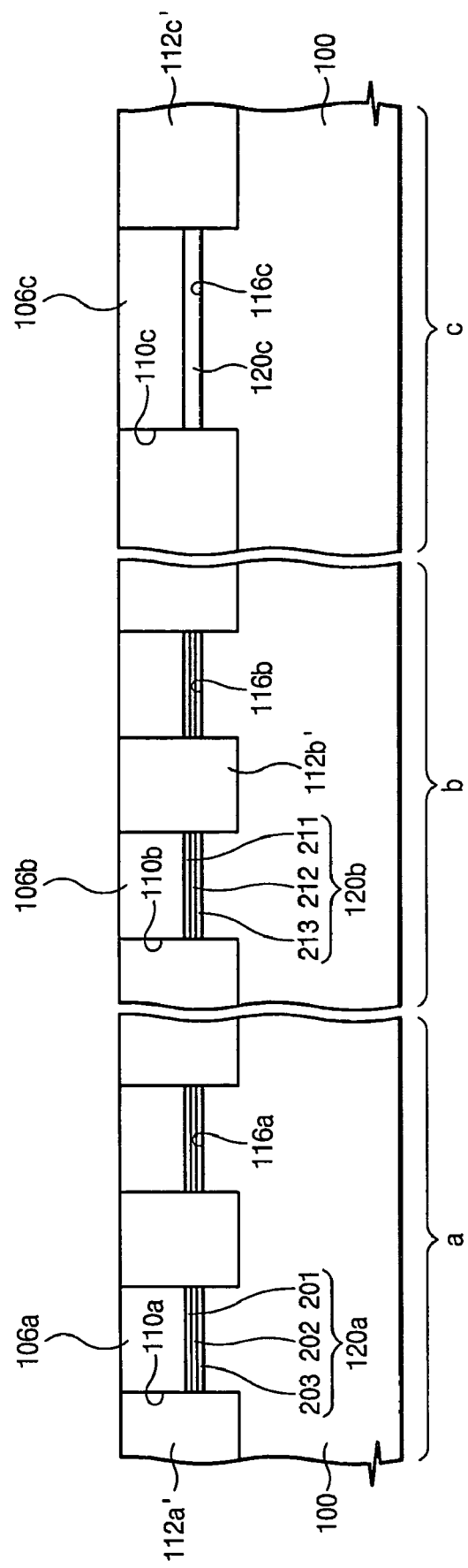

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 of Korean Patent Application 10-2005-0118325 filed in the Korean Intellectual Property Office on Dec. 6, 2005, the entire contents of which are hereby incorporated by reference.

BACKGROUND

The subject matter described herein is concerned with semiconductor devices and methods of fabricating the same, and in particular relates to a semiconductor device and method of fabricating the same suitable for high integration density.

Semiconductor memory devices can be roughly classified into volatile and nonvolatile devices. Volatile memories, including, for example, dynamic random access memories (DRAM) and static random access memories (SRAM), lose their data when power supplies are removed. Nonvolatile memories retain their data even without power supplies applied to them. A flash memory device is one type of nonvolatile memory device. The flash memories are becoming important devices for use as storage media since they are able to electrically write and erase data in addition to the data retention capability independent of powering backup.

Generally, the flash memory devices employ electrically isolated floating gates for storing information. A cell of the flash memory device is able to store a data bit that is logically '0' or '1' according to presence of charges in the floating gate. However, as the charges remain as free charges in the floating gate, all of the charges can be lost when there is a defect or damage on a tunnel oxide film under the floating gate. Thus, it could be required to form the tunnel oxide film to a large thickness under the floating gate. Such a thicker tunnel oxide film may increase an operation voltage of the flash memory device, making it difficult to implement high integration density and hence raising the rate of power consumption. There has been proposed a floating-trap nonvolatile memory device for the purpose of overcoming the drawback of the weak tunnel oxide film. The floating-trap nonvolatile memory device uses a charge-trapping insulation film, which has traps with deep potentials, as an information storage member. By placing charges in the deep potentials of the traps, it offers stability in retaining the charges even when the tunnel oxide film is partially damaged.

Recent advancement of device technologies demands higher integration density in morphological dimensions of semiconductor devices. Along with higher density of semiconductor devices, it is possible to enhance the capacity of data storage and to reduce power consumption thereof.

However, there are also generated various problems by the higher integration density. For instance, field effect transistors used as unit elements of the semiconductor devices would be degraded in the characteristic of punch-through because of narrower distances between their source and drain regions.

Further, a unit cell of the DRAM is required to have larger capacitance in a restrictive region and vertically higher storage electrodes, which makes it difficult to carry out photolithography and/or etching processes due to high step differences.

Additionally, as an electrically writable/erasable nonvolatile memory device is also required to have larger storage capacity, more memory cells nee to be integrated in a given area. However, since there is a limit to the minimum line width defined by the photolithography process, it becomes more difficult to implement such a larger-capacity nonvolatile memory device.

Therefore, advanced technologies for solving the various problems associated with higher integration density of semiconductor devices are being studied.

SUMMARY OF THE INVENTION

In one aspect, the present invention is directed to a semiconductor device which includes a dielectric film and an active pattern that are stacked in sequence on a substrate and a gate electrode crossing over the active pattern. A gate insulation film is interposed between the gate electrode and the active pattern, and a pair of impurity layers are formed in the active pattern at both sides of the gate electrode, respectively, and defining a channel region under the gate electrode. The bottoms of the impurity layers contact with the top of the dielectric film. The channel region is a data storage field and the substrate is supplied with a voltage to provide attraction for excessive charges stored in the channel region.

In one embodiment, the semiconductor device further comprises: a field isolation film filling a trench formed in the substrate around the active pattern and covering sidewalls of the dielectric film and the active pattern. The top of the field isolation film is partially leveled lower than the top of the dielectric film and forms the bottom of a recess region, a sidewall of the recess region partially including a sidewall of the active pattern. The dielectric film partially extends along the bottom and sidewall of the recess region.

In one embodiment, the semiconductor device further comprises: an embedded pattern disposed on the extending portion of the dielectric film, filling the recess region.

In one embodiment, the excessive charges are the same polarity as majority carriers of the channel region.

In one embodiment, the dielectric film includes an insulation material higher than silicon oxide in dielectric constant.

According to another aspect, the invention is directed to a semiconductor device which includes an active pattern and a multi-level insulation film that includes a lower charge-trapping film, being stacked on a substrate in sequence, and a gate electrode crossing over the active pattern. A gate insulation film is interposed between the gate electrode and the active pattern, and a pair of impurity layers are formed in the active pattern at both sides of the gate electrode, respectively, and defining a channel region under the gate electrode. The bottoms of the impurity layers contact with the top of the multi-level insulation film.

In one embodiment, the gate insulation film is formed of a single layer of insulation material.

In one embodiment, the gate insulation film includes a tunnel insulation film, an upper charge-trapping film, and a blocking insulation film, which are stacked in sequence.

In one embodiment, the multi-level insulation film further comprises: a first insulation film interposed between the lower charge-trapping film and the active pattern; and a second insulation film interposed between the lower charge-trapping film and the substrate.

In one embodiment, the semiconductor device further comprises: a field isolation film filling a trench formed in the substrate around the active pattern and covering sidewalls of the multi-level insulation film and the active pattern. The top of the field isolation film is partially leveled lower than the top of the multi-level insulation film and forms the bottom of a recess region, a sidewall of the recess region partially including a sidewall of the active pattern. The multi-level insulation film partially extends along the bottom and sidewall of the recess region.

In one embodiment, the semiconductor device further comprises: an embedded pattern disposed on the extending portion of the multi-level insulation film, filling the recess region.

According to another aspect, the present invention is directed to a semiconductor device which includes a substrate including first and second regions. A first active pattern and a dielectric film are stacked in sequence on the substrate of the first region, and a second active pattern and a multi-level insulation film are stacked in sequence on the substrate of the second region. The multi-level insulation film includes a lower charge-trapping film. First and second gate electrodes cross over the first and second active patterns, respectively. First and second gate insulation films are interposed between the first gate electrode and the first active pattern, and between the second gate electrode and the second active pattern, respectively. A pair of first impurity layers are formed in the first active pattern at both sides of the first gate electrode, respectively, and define a first channel region under the first gate electrode. The bottoms of the first impurity layers contact with the top of the dielectric film. A pair of second impurity layers are formed in the second active pattern at both sides of the second gate electrode, respectively, and define a second channel region under the second gate electrode. The bottoms of the second impurity layers contact with the top of the multi-level insulation film. The first channel region is used as a data storage field.

In one embodiment, the substrate of the first region is supplied with a voltage to provide attraction for excessive charges stored in the first channel region, the excessive charges being of the same polarity as majority carriers of the first channel region.

In one embodiment, the second gate insulation film is formed of a single layer of insulation material.

In one embodiment, the second gate insulation film includes a tunnel insulation film, an upper charge-trapping film, and a blocking insulation film, which are stacked in sequence.

In one embodiment, the dielectric film and the multi-level insulation film are made of the same material.

In one embodiment, the semiconductor device further comprises: a first field isolation film filling a first trench formed in the substrate of the first region around the first active pattern and covering sidewalls of the dielectric film and the first active pattern; and a second field isolation film filling a second trench formed in the substrate of the second region around the second active pattern and covering sidewalls of the multi-level insulation film and the second active pattern. The top of the first field isolation film is partially leveled lower than the top of the dielectric film and forms the bottom of a first recess region, a sidewall of the first recess region partially including a sidewall of the first active pattern, and the dielectric film partially extends along the bottom and sidewall of the first recess region. The top of the second field isolation film is partially leveled lower than the top of the multi-level insulation film and forms the bottom of a second recess region, a sidewall of the second recess region partially including a sidewall of the second active pattern, and the multi-level insulation film partially extends along the bottom and sidewall of the second recess region.

In one embodiment, the semiconductor device further comprises: a first embedded pattern disposed on the extending portion of the dielectric film, filling the first recess region; and a second embedded pattern disposed on the extending portion of the multi-level insulation film, filling the second recess region.

In one embodiment, the substrate further includes a third region, which further comprises: a third active pattern and a lower insulation film stacked in sequence on the substrate of the third region; a third gate electrode crossing over the third active pattern; a third gate insulation film interposed between the third gate electrode and the third active pattern; and a pair of third impurity layers formed in the third active pattern at both sides of the third gate electrode, respectively.

In one embodiment, the semiconductor device further comprises: a third field isolation film filling a third trench formed in the substrate of the third region around the third active pattern and covering sidewalls of the lower insulation film and the third active pattern. The top of the third field isolation film is partially leveled lower than the top of the lower insulation film and forms the bottom of a third recess region, a sidewall of the third recess region partially including a sidewall of the third active pattern. The lower insulation film partially extends along the bottom and sidewall of the third recess region.

In one embodiment, the semiconductor device further comprises: a third embedded pattern disposed on the extending portion of the lower insulation film, filling the third recess region.

In another aspect, the invention is directed to a method of fabricating a semiconductor device. The method may comprise the steps of: forming a sacrificial film and an active layer in sequence on a substrate; successively patterning the active layer, the sacrificial film, and the substrate to form a sacrificial pattern and an active pattern stacked in sequence, and a trench; forming a field isolation film to fill the trench; partially recessing the field isolation film to partially expose the sacrificial pattern; removing the sacrificial pattern by isotropically etching to form an empty region; forming a dielectric film to fill the empty region; forming a gate insulation film and a gate electrode to be stacked in sequence on the active pattern; and forming a pair of impurity layers to locate in the active pattern at both sides of the gate electrode, respectively. The bottoms of the impurity layers contact with the dielectric film. The channel region between the impurity layers is a data storage field.

In one embodiment, the substrate is supplied with a voltage to provide attraction for excessive charges stored in the channel region In one embodiment, the method further comprises forming an embedded pattern to fill the recess region on the dielectric film formed on the bottom and sidewall of the recess region of the field isolation film.

In one embodiment, the dielectric film includes an insulation material higher than silicon oxide in dielectric constant.

According to another aspect, the invention is directed to a method of fabricating a semiconductor device, comprising: forming a sacrificial film and an active layer in sequence on a substrate; successively patterning the active layer, the sacrificial film, and the substrate to form a sacrificial pattern and an active pattern stacked in sequence, and a trench; forming a field isolation film to fill the trench; partially recessing the field isolation film to partially expose the sacrificial pattern; removing the sacrificial pattern by isotropically etching to form an empty region; forming a multi-level insulation film to fill the empty region, the multi-level insulation film including a lower charge-trapping film; forming a gate insulation film and a gate electrode to be stacked in sequence on the active pattern; and forming a pair of impurity layers to locate in the active pattern at both sides of the gate electrode, respectively, the bottoms of the impurity layers contacting with the multi-level insulation film.

In one embodiment, the gate insulation film is formed of a single layer of insulation material.

In one embodiment, the gate insulation film includes a tunnel insulation film, an upper charge-trapping film, and a blocking insulation film, which are stacked in sequence.

In one embodiment, forming the multi-level insulation film is comprised of: oxidizing the substrate having the recess region to form first and second insulation films to contact each with the top and bottom of the recess region; and forming the lower charge-trapping film to fill the recess region between the first and second insulation films.

In one embodiment, the method further comprises: forming an embedded pattern to fill the recess region on the dielectric film formed on the bottom and sidewall of the recess region of the field isolation film.

According to another aspect, the invention is directed to a method of fabricating a semiconductor device, comprising: forming a sacrificial film and an active layer in sequence on a substrate including first and second regions; successively patterning the active layer, the sacrificial film, and the substrate, in the first region, to form first sacrificial pattern and first active region stacked in sequence, and a first trench; successively patterning the active layer, the sacrificial film, and the substrate, in the second region, to form second sacrificial pattern and second active pattern sequentially stacked, and a second trench; forming first and second field isolation films to fill the first and second trenches, respectively; partially recessing the field and second isolation films to partially expose the first and second sacrificial patterns, respectively; removing the first and second sacrificial patterns by isotropically etching to form first and second empty regions of the first and second regions, respectively; forming a dielectric film to fill the first empty region; forming a multi-level insulation film to fill the second empty region, the multi-level insulation film including a lower charge-trapping film; forming a first gate insulation film and a first gate electrode to be stacked in sequence on the first active pattern; forming a second gate insulation film and a second gate electrode to be stacked in sequence on the second active pattern; forming a pair of first impurity layers to locate in the first active pattern at both sides of the first gate electrode, respectively, the bottoms of the first impurity layers contacting with the dielectric film; and forming a pair of second impurity layers to locate in the second active pattern at both sides of the second gate electrode, respectively, the bottoms of the second impurity layers contacting with the multi-level insulation film. The channel region between the first impurity layers is used as a data storage field.

A further understanding of the nature and advantages of the inventions herein may be realized by reference to the remaining portions of the specification and the attached drawings

BRIEF DESCRIPTION OF THE FIGURES

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 4A, 5A, 6A, 7A and 8A are sectional views illustrating processing steps for fabricating the semiconductor device according to an embodiment of the invention, taken along lines I-I', II-II', and III-III' of FIG. 1.

FIGS. 4C, 5C, 6C, 7C and 8C are sectional views illustrating processing steps for fabricating the semiconductor device according to an embodiment of the invention, taken along lines VII-VII', VIII-VIII', and IX-IX' of FIG. 1.

DETAILED DESCRIPTION OF PREFERRED EMBODIMENTS

Figure 1:
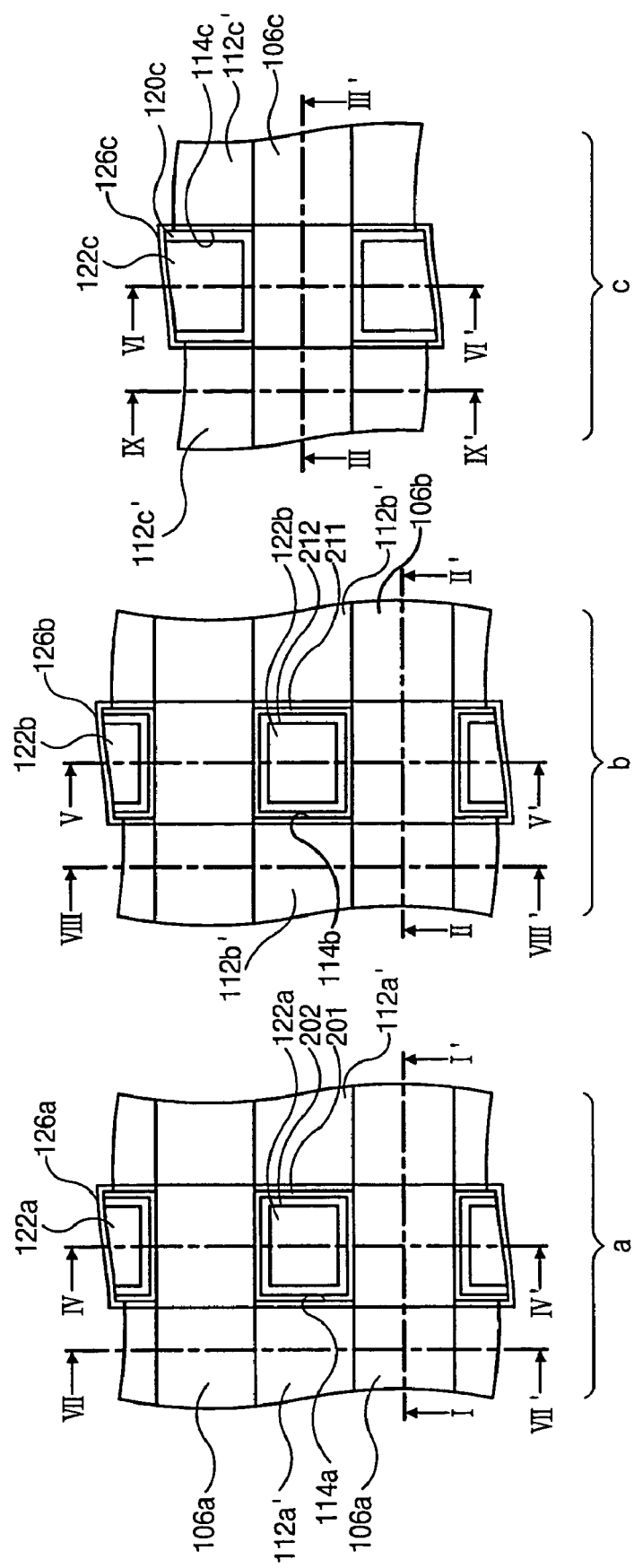
FIG. 1 illustrates partial plans of a semiconductor device in accordance with an embodiment by the invention.

Preferred embodiments of the present invention will be described below, in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions are exaggerated for clarity of illustration. It will also be understood that when a layer is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 2A:
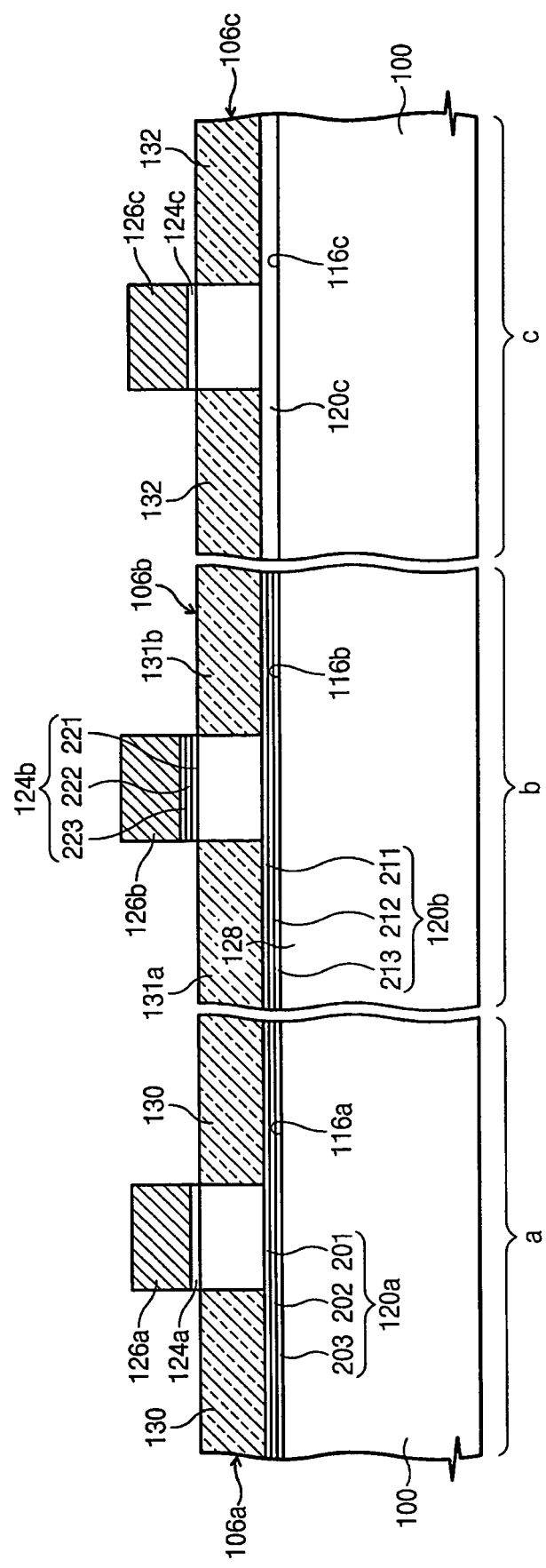
FIG. 2A illustrates sections taken along lines I-I', II-II', and III-III' of FIG. 1.
Figure 2B:
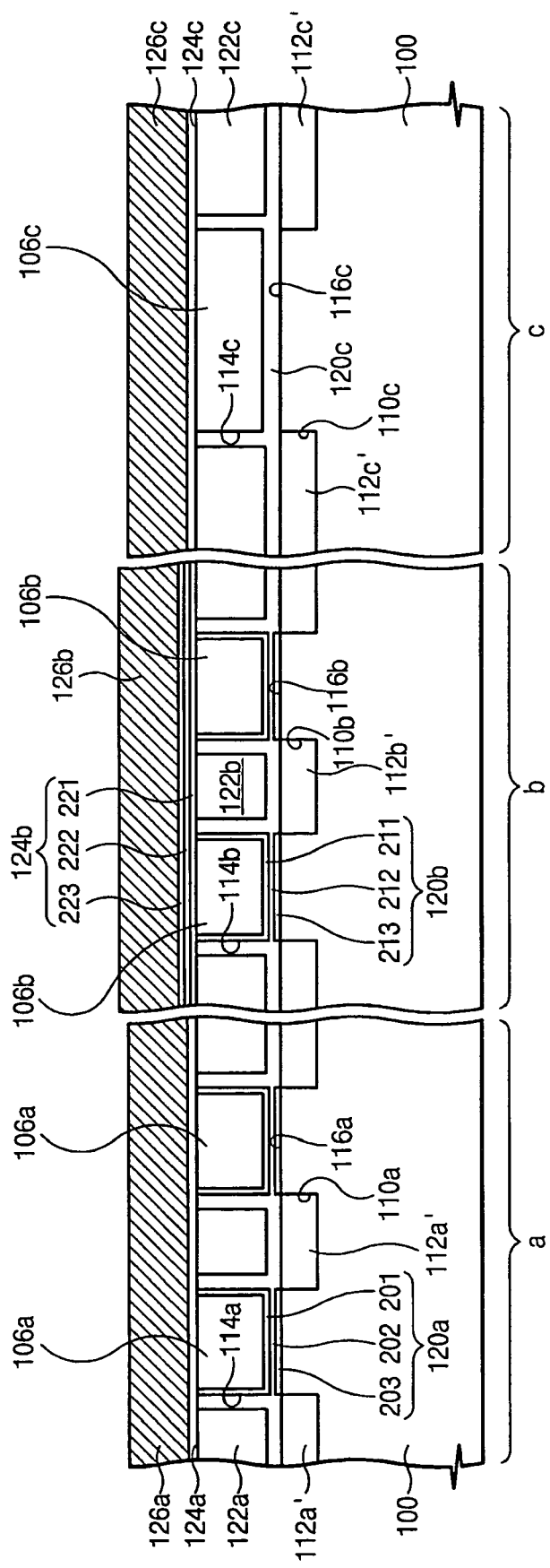
FIG. 2B illustrates sections taken along lines IV-IV', V-V', and VI-VI' of FIG. 1.
Figure 2C:
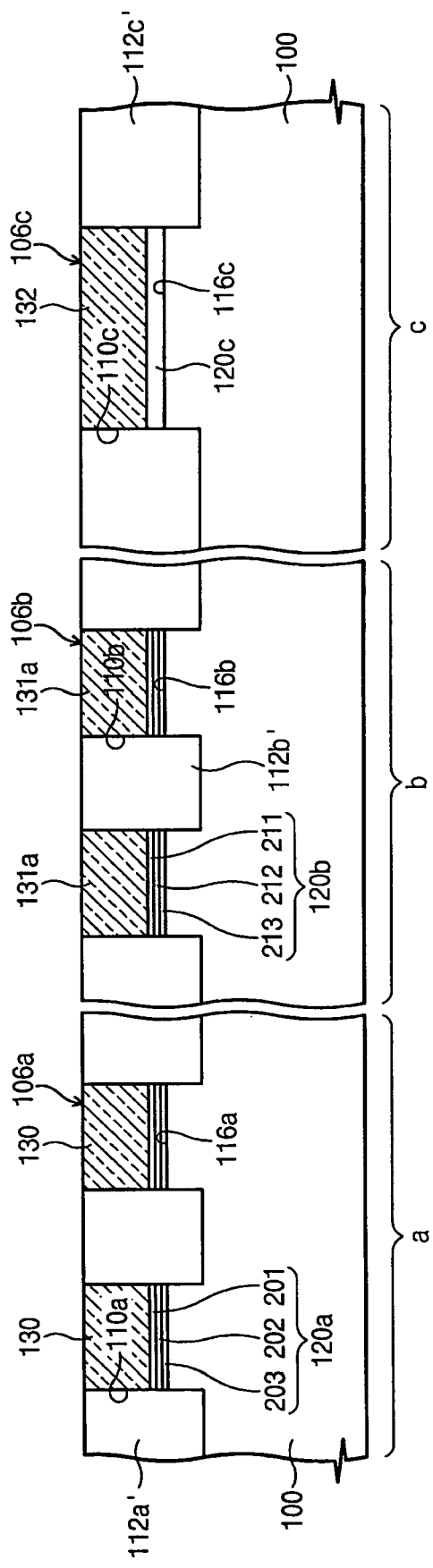
FIG. 2C illustrates sections taken along lines VII-VII', VIII-VIII', and IX-IX' of FIG. 1.
Figure 3:
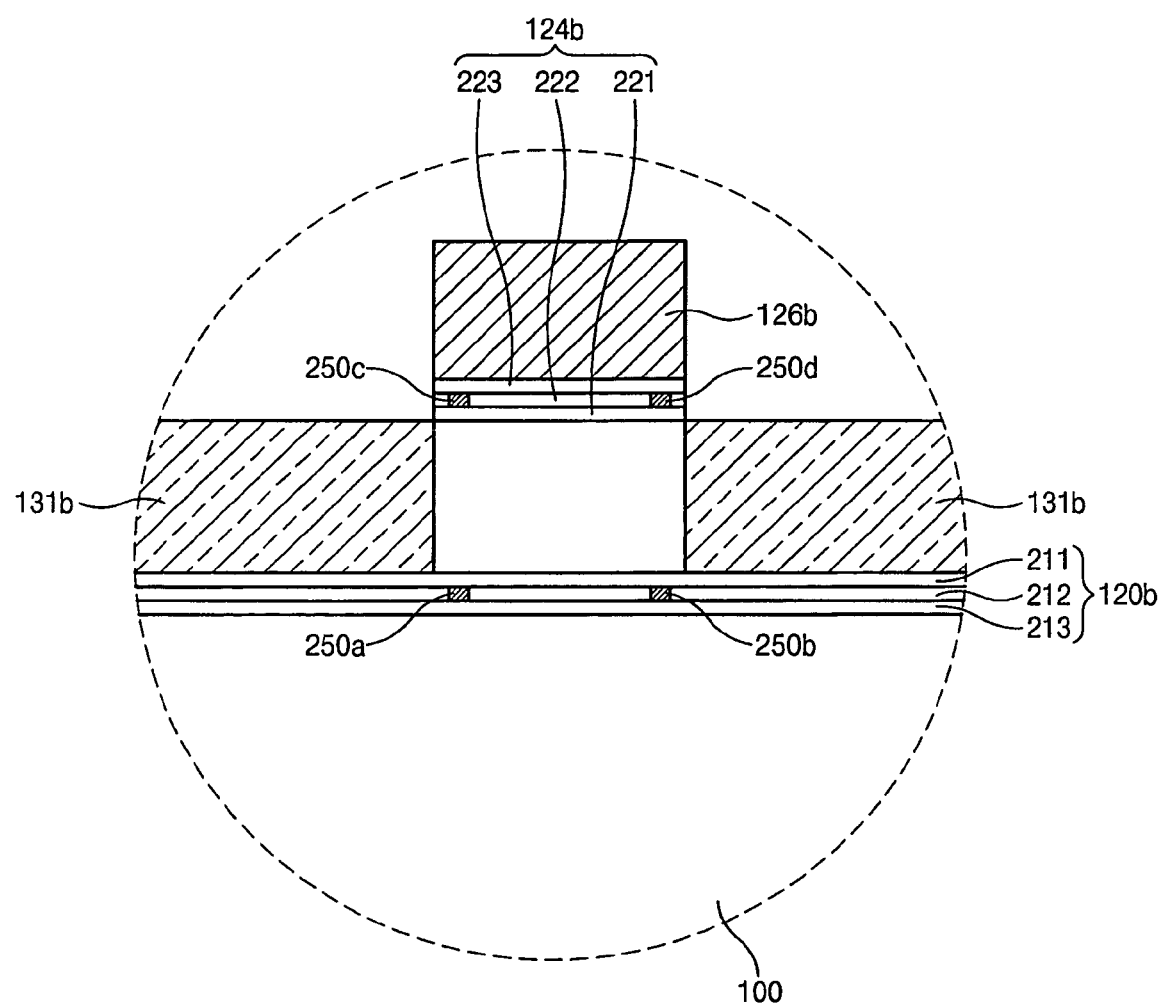
FIG. 3 is an sectional view illustrating a nonvolatile memory cell shown in FIG. 2A.

FIG. 1 illustrates partial plans of a semiconductor device in accordance with an embodiment by the invention. FIG. 2A illustrates sections taken along lines I-I', II-II', and III-III' of FIG. 1, and FIG. 2B illustrates sections taken along lines IV-IV', V-V', and VI-VI' of FIG. 1. Further, FIG. 2C illustrates sections taken along lines VII-VII', VIII-VIII', and IX-IX' of FIG. 1. FIG. 3 is a sectional view enlarging a nonvolatile memory cell shown in FIG. 2A.

Referring to FIGS. 1, 2A, 2B, and 2C, a semiconductor substrate (hereinafter, referred to as 'substrate') 100 includes a first region a, a second region b, and a third region c. The first region a corresponds to a region including volatile memory cells, and the second region b corresponds to a region including nonvolatile memory cells. The third region c corresponds to a region including field effect transistors belonging to peripheral circuits.

Dielectric films 120a and first active patterns 106a are sequentially stacked on the first region a of the substrate 100. In detail, the dielectric films 120a fill first empty 20 regions 116a between the first active patterns 106a and the substrate 100. The first active patterns 106a are arranged in parallel on the substrate 100, being isolated from each other.

First field isolation films 112a' fill first trenches 110a formed around the first active patterns 106a in the first region a of the substrate 100. The first field isolation films 112a' cover sidewalls of the first active patterns 106a and the dielectric films 120a. Each of the first field isolation films 112a' is comprised of first and second portions. The top of the first portion of the first field isolation film 112a' is leveled lower than the top of the dielectric film 120a locating in the first empty regions 116a. The top of the first portion of the first field isolation film 112a' may be leveled with or lower than the bottom of the first empty region 116a. The top of the second portion of the first field isolation film 112a' may be leveled with or lower than the top of the first active pattern 106a. Thus, first recess regions 114a are disposed at the first field isolation films 112a'. The bottoms of the first recess regions 114a meet with the tops of the first portions of the first field isolation films 112a'. A sidewall of the first recess region 114a includes a sidewall of the second portion of the first field isolation film 112a', and a sidewall of the first active pattern 106a adjacent to the first portion of the first field isolation film 112a'. That is, a part of the sidewall of the first active pattern 106a is covered by the second portion of the first field isolation film 112a', while the other part of the sidewall of the first active pattern 106a is not covered by the first field isolation film 112a' due to the presence of the first recess region 114a.

Sidewalls of the first trenches 110a are aligned to the sidewalls of the first active patterns 106a. The sidewalls of the first trenches 110a are also aligned to the sidewalls, which are each formed of the sidewalls of the first active patterns 106a, of the first recess regions 114a. Further, the sidewalls of the first trenches 110a are aligned to partial sidewalls of the dielectric films 120a disposed in the first empty regions 114a.

The dielectric film 120a partially extends to cover the bottom and sidewall of the first recess region 114a. That is, the dielectric film 120a partially extends to cover the top of the first portion of the first field isolation film 112a' and the sidewall of the first active pattern 106a exposed by the first recess region 114a. The top face of the dielectric film 120a, covering the sidewall of the first active pattern 106a, may be leveled with the top of the first active pattern 106a.

On the extending portions of the dielectric films 120a are disposed first embedded patterns 122a. The first embedded patterns 122a fill the first recess regions 114a. In other words, the dielectric film 120a partially extends to be interposed between the first embedded pattern 122a and the bottom and sidewall of the first recess region 114a. The top of the first embedded pattern 122a may be leveled with the top of the second portion of the first field isolation film 112a'.

The first active patterns 106a are formed of a semiconductor. For example, the first active patterns 106a may be made of single crystalline silicon. Each of the dielectric film 120a includes a high-k film (k: dielectric constant) 202 having a higher dielectric constant than silicon oxide. For instance, the high-k film 202 may be made of silicon nitride. Alternatively, the high-k film 202 may be formed of insulative metal oxide (e.g., hafnium oxide or aluminum oxide) having a higher dielectric constant than silicon nitride. The portion of the dielectric film 120a, extending upward the bottom and sidewall of the first recess region 114a, includes the high-k film 202. Each of the dielectric film 120a may be further comprised of a first oxide film 201 interposed between the high-k film 202 and the top of the first empty region 116a (i.e., the bottom of the first active pattern 106a), and a second oxide film 203 interposed between the high-k film 202 and the bottom of the first empty region 116a (i.e., the upper face of the substrate 100). The first field isolation films 112a' may be formed of silicon oxide. The first embedded patterns 122a may be formed of silicon oxide.

A first gate electrode 126a crosses over the first active patterns 106a, and a first gate insulation film 124a is interposed between the first gate electrode 126a and the first active pattern 106a. The first gate electrode 126a intersects the first active patterns 106a arranged in parallel. The first gate electrode 126a may be arranged in parallel with a predetermined interval in plurality over the first region a of the substrate 100. The first gate electrode 126a is made of a conductive material. For instance, the first gate electrode 126a may be formed including doped polysilicon, metal (e.g., tungsten or molybdenum), conductive metal nitride (e.g., titanium nitride or tantalum nitride), or metal silicide (e.g., tungsten silicide or cobalt silicide). The gate insulation film 124a may be formed of silicon oxide.

At both sides of the first gate electrode 126a, a pair of first impurity layers 130 are formed in the first active pattern 106a. The first active pattern's region between the first impurity layers 130 adjacent to each other is defined as a first channel region. The first channel regions are disposed under the first gate electrodes 126a. The bottoms of the couple of the first impurity layers 130 contact with the dielectric film 120a placed in the first empty region 116a. Thus, the first channel regions are floated with being isolated from each other. The first channel regions floating therein are used as data storage fields for the volatile memory cells.

A unit of the volatile memory cell is comprised of the first gate electrode 126a, the pair of the first impurity layers 130 placed at both sides of the first gate electrode 126a, and the first channel region between the first impurity layers 130. The pair of the impurity layers 130 are correspondent with source/drain regions of the volatile memory cell.

The volatile memory cell is variable in threshold voltage by presence or absence of excessive charges in the first channel region. The excessive charges are preferred to be the same type, i.e., of the same polarity or conductivity type, as majority carriers of the first channel region. In detail, the volatile memory cell where the first channel region is including excessive charges has a first threshold voltage, while the volatile memory cell where the first channel region is conditioned without excessive charges has a second threshold voltage. The first threshold voltage is different from the second threshold voltage. For instance, if the first impurity layers 130 are doped with N-type impurities, the excessive charges are holes and the second threshold voltage is higher than the first threshold voltage. By applying a sensing voltage, which is intermediate between the first and second threshold voltages, to the first gate electrode 126a, it is able to determine whether a data bit stored in the volatile memory cell is logically '0' or '1'.

It is preferred to supply the substrate 100 with a voltage to provide attraction for excessive charges in the first channel region. Accordingly, it enhances the capability of data retention in the volatile memory cell. That is, it is possible to lengthen a time for holding excessive charges in the first channel region by applying the voltage for attraction to the first region a of the substrate 100. Further, the voltage of attraction is helpful to extending a non-depletion region in the first channel region, which assures a sufficient space for storing the excessive charges thereto. The voltage of attraction applied to the first region a of the substrate 100 is preferred to be normally conductive while the volatile memory cell is being active.

Storing excessive charges in the first channel region may be accomplished by using hot carrier effect or gate-induced drain leakage (GIDL) effect. In the case that the volatile memory cell is an NMOS type, the hot carrier effect generates hot carriers in the channel region adjacent to one of the first impurity layers 130. According to this method, the hot carriers induce electron-hole pairs and holes are accumulated in the first channel region. Thus, the first channel region is able to store excessive charges capable of maintaining a voltage therein lower than a threshold voltage (about 0.7V) of a PN junction between the first impurity layer 130 and the first channel region. Thereby, a depletion layer in a region where the first gate electrode 126a overlaps with the first impurity layer 130 get abruptly bent to make electrons tunnel into the conduction band from the valence band. During this, the tunneling electrons induce electron-hole pairs and holes generated therein are stored in the first channel region as the excessive charges.

Removing the excessive charges from the floating channel region is accomplished by setting a forward bias to the PN junction between and the first impurity layer 130 and the first channel region. Thereby, the excessive charges flow out from the first channel region.

The pair of the first impurity layers 130 belonging to the volatile memory cell may be shared by other volatile memory cells placed at both sides thereof in the same of the first active pattern 106. As a result, when the minimum width definable by a typical photolithography process is 'F', it is possible to optimize integration density of the unit volatile memory cell in the area of $4F^2$.

As aforementioned, the first region a of the substrate 100 is supplied with the voltage providing attraction to excessive charges of the first channel region. Here, the dielectric film 120a is formed including an insulation material having a higher dielectric constant than silicon oxide. Thus, the voltage for attraction increases a voltage induced in the first channel region. As a result, it decreases the absolute value of the attraction voltage, reducing power consumption in the semiconductor device and hence implementing a highly integrated semiconductor device.

Referring to FIGS. 1, 2A, 2B, 2C, and 3, multi-level insulation films 120b and second active patterns 106b are stacked in sequence on the second region b of the substrate 100. The multi-level insulation films 120b fill second empty regions 116b between the second active patterns 106b and the second region b of the substrate 100. The second active patterns 106b may be arranged in parallel on the second region b of the substrate, being isolated from each other.

Each of the multi-level insulation films 120b is comprised of a lower charge-trapping film 212. The multi-level insulation film 120b further includes a first insulation film 211 interposed between the lower charge-trapping film 212 and the second active pattern 106b, and a second insulation film 213 interposed between the lower charge-trapping film 212 and the substrate 100.

Second field isolation films 112b' fill second trenches 110b formed around the second active patterns 106b in the second region b of the substrate 100, covering sidewalls of the second active patterns 106b and the multi-level insulation films 120b. Each of the second field isolation films 112b' is composed of first and second portions. The top of the first portion of the second field isolation film 112b' is leveled lower than the top of the multi-level film 120b placed in the second empty region 116b. The top of the first portion of the second field isolation film 112b' may be leveled with or lower than the bottom of the second empty region 116b. The top of the second portion of the second field isolation film 112b' may be leveled with or lower than the second active pattern 106b. Thus, second recess regions 114b are defined in the second field isolation films 106b. The bottom of the second recess region 114b meets with the top of the first portion of the second field isolation film 112b', and a sidewall of the second recess region 114b includes a sidewall of the second portion of the second field isolation film 112b', and a sidewall of the second active pattern 106b adjacent to the first portion of the second field isolation film 112b'. The second portion of the second field isolation film 112b' partially covers the sidewalls of the multi-level insulation film 120b in the second empty region 116b.

The multi-level insulation film 120b partially extends to cover the bottom and sidewall of the second recess region 114b. That is, the extending portion of the multi-level insulation film 120b covers to top of the second portion of the second field isolation film 112b' and the sidewall of the second active pattern 106b which forms with the sidewall of the second recess region 114b. Specifically, the extending portion of the multi-level insulation film 120b includes the lower charge-trapping film 212 at least. On the extending portions of the multi-level insulation films 120b, second embedded patterns 122b are disposed to fill the second recess regions 114b. The top of the second embedded pattern 122b may be leveled with the top of the second portion of the second field isolation film 112b'.

The second active patterns 106 may be formed of a semiconductor, e.g., single crystalline silicon. The lower charge-trapping films 212 are made of an insulator having traps of deep potential. For instance, the lower charge-trapping films 212 may be formed of insulation films containing silicon nitride or pluralities of nano-crystals. These nano-crystals may be made of a semiconductor. The first and second insulation films 211 and 213 may be formed of silicon oxide, as well as the second field isolation films 112b' and the second embedded patterns 122b.

A second gate electrode 126b crosses over the second active patterns 106b. Between the second gate electrode 126b and the second active pattern 106b is interposed a second gate insulation film 124b. The second gate insulation electrode may be arranged in parallel with a predetermined interval in plurality over the second region b of the substrate 100. The second gate insulation film 125b may be composed of a single layer of insulation film. Alternatively, the second gate insulation film 124b may be comprised of a tunnel insulation film 221, an upper charge-trapping film 222, and a blocking insulation film 223 those are stacked in sequence.

The second gate electrode 126b is made of a conductive material. For instance, the second gate electrode 126b may be formed including doped polysilicon, metal (e.g., tungsten or molybdenum), conductive metal nitride (e.g., titanium nitride or tantalum nitride), or metal silicide (e.g., tungsten silicide or cobalt silicide). If the second gate insulation film 124b is formed of a single insulation material, it may be made of silicon oxide. Otherwise, when the second gate insulation film 124b is composed of the films 221, and 222, and 223, those films may be made of materials as described hereafter. The tunnel insulation film 221 may be made of silicon oxide, and the upper charge-trapping film 222 is formed of a material having traps of deep potential. For example, the upper charge-trapping film 222 may be formed of an insulation film containing silicon nitride or pluralities of nano-crystals. The blocking insulation film 223 may be formed of silicon oxide. The blocking insulation film 223, otherwise, may contain a high-k (k: dielectric constant) film having a higher dielectric constant than the tunnel oxide film 221, e.g., an insulative metal oxide such as aluminum oxide or hafnium oxide.

A pair of second impurity layers 131a and 131b are formed at both sides of the second gate electrode 126b in the second active pattern 106b. The second active pattern 106b between the second impurity layers adjacent to each other is defined as a second channel region. The second channel regions are disposed each under the second gate electrodes 126b. The bottoms of the second impurity layers 131a and 131b are preferred to contact with the top of the multi-level insulation film 120a.

The nonvolatile memory cell is comprised of the second channel region, the multi-level insulation film 120b and the second gate insulation film 124b those are respectively disposed the upper and lower portions of the second channel region, the pair of the second impurity layers 131a and 131b disposed each at both sides of the second channel region, and the second gate electrode 126b. The second impurity layers, 131a and 131b, are correspondent with first and second source/drain regions, respectively.

The lower charge-trapping film 212 placed under the second channel region is used as a data storage field. A threshold voltage of the nonvolatile memory cell is variable in accordance with presence of charges in the lower charge-trapping film 212. In other words, charges stored in the lower charge-trapping film 212 makes an effect of setting a back bias to the second channel region. Thus, the back bias condition at the second channel region varies dependent on presence or absence of the charges stored in the lower charge-trapping film 212, changing the threshold voltage of the nonvolatile memory cell. Using such variation of threshold voltage, a data bit is read out from the nonvolatile memory cell. The nonvolatile memory cell may be formed in an NMOS type where the first and second source/drain regions 131a and 131b are doped with N-type impurities while the second channel region is doped with P-type impurities. Otherwise, the nonvolatile memory cell may be formed in a PMOS type where the first and second source/drain regions 131a and 131b are doped with P-type impurities while the second channel region is doped with P-type impurities. Hereinafter, for convenience of description, it will be detailed about operations by the nonvolatile memory cell that is an NMOS type.

Operations of the nonvolatile memory cell where the second gate insulation film 124b is composed of a single insulative layer will be described herein. In this case, the lower charge-trapping film 212 under the second channel region is able to store 1-bit or 2-bit data therein. At least one of first and second sectors 250a and 250b in the lower charge-trapping film 212 is correspondent with the data storage field. The first and second sectors 250a and 250b are isolated from each other. When one of first and second sectors 250a and 250b is used as the data storage field, the nonvolatile memory cell is able to store 1-bit data. When all of first and second sectors 250a and 250b are used as the data storage field, the nonvolatile memory cell is able to store 2-bit data.

Storing electrons into the data storage filed is accomplished by way of hot carrier injection. As an example, 0V is applied to the second region b of the substrate 100, while a writing gate voltage is applied to the second gate electrode 126b. The first and second source/drain regions 131a and 131b are supplied each with first and second writing source/drain voltages. The writing gate voltage and the first and second writing source/drain voltages are all negative. When the second writing source/drain voltage is a negative lower than the first writing source/drain voltage, electrons are stored in the first sector 250a. When the first writing source/drain voltage is a negative lower than the second writing source/drain voltage, electrons are stored in the second sector 250a.

Erasing electrons from the data storage field may use Fowler-Nordheim (FN) tunneling mode, or a method for injecting holes thereinto by hot carrier injection. In employing the FN tunneling mode, electrons are removed from the data storage field by generating a voltage difference between the second gate electrode 126b and the substrate 100 of the second region b. The operation of erasing electrons from the data storage field may be carried out in the unit of cell or cell block.

A method of reading data from the nonvolatile memory cell will now be described. In reading a data bit from the first sector 250a, a read voltage is applied to the second gate electrode 126b, the ground voltage is applied to the first source/drain region 131a, and a positive drain voltage is applied to the second source/drain region 131b. The positive drain voltage applied to the second source/drain region 131b causes the second channel region to be depleted around the second sector 250b. Thus, it is able to detect a threshold voltage of the nonvolatile memory cell in accordance with a state of data stored in the first sector 250a without being affected from data stored in the second sector 250b. During this, the substrate 100 of the second region b may be supplied with 0V.

In reading a data bit from the second sector 250b, a read voltage is applied to the second gate electrode 126b, a positive drain voltage is applied to the first source/drain region 131a, and the ground voltage is applied to the second source/drain region 131b. The positive drain voltage applied to the first source/drain region 131a causes the second channel region to be depleted around the first sector 250a. Thus, it is able to detect a threshold voltage of the nonvolatile memory cell in accordance with a state of data stored in the second sector 250b without being affected from data stored in the first sector 250a. As also, during this, the substrate 100 of the second region b may be supplied with 0V.

As described above, the second gate insulation film 124b may be comprised of a tunnel insulation film 221, an upper charge-trapping film 222, and a blocking insulation film 223 those are stacked in sequence thereon. Operational modes of the nonvolatile memory cell including the upper charge-trapping film 222 will now be described. Also, for convenience of description, it will be assumed that the nonvolatile memory cell is an N-type. In this case, the nonvolatile memory cell is able to store 1-bit through 4-bit data by the lower and upper charge-trapping films 212 and 222. That is, the data storage field is selected from the first and second sectors 250a and 250b aforementioned, and the third and fourth sectors 250c and 250d, which are adjacent each to the first and second source/drain regions 131a and 131b, of the upper charge-trapping film 212.

When one of the first through fourth sectors 250a, 250b, 250c, and 250d is selected as the data storage field, the nonvolatile memory cell is able to store 1-bit data. Otherwise, two of the first through fourth sectors 250a, 250b, 250c, and 250d is selected as the data storage fields, the nonvolatile memory cell is able to store 2-bit data. On the other hand, the first through fourth sectors 250a, 250b, 250c, and 250d are all used as the data storage fields, the nonvolatile memory cell is able to store 4-bit data.

As an example, operations of the nonvolatile memory cell using the first through fourth sectors 250a~250d all as the data storage fields will be described. First, a writing operation in the nonvolatile memory cell will be described. Storing electrons in the first and second sectors 250a and 250b may be carried out in the same progress with the case that the second gate insulation film 124b is formed of a single layer of insulation material. Storing electrons into the third sector 250c is accomplished by applying: 0V to the second region b of the substrate 100; a positive writing gate voltage to the second gate electrode 126b; a positive source/drain voltage to the first source/drain voltage; and 0V to the second source/drain region 131b. According to this, hot carriers are generated in the second channel region adjacent to the third sector 250c, inducing electron-hole pairs. The electrons generated therein are stored in the third sector 150c. Otherwise, when 0V is applied to the first source/drain region and a positive voltage is applied to the second source/drain region 131b, electrons are forced to be stored in the fourth sector 250d.

Erasing electrons from the first through fourth sectors 250a~250d may use Fowler-Nordheim (FN) tunneling mode, or a method for injecting holes thereinto by hot carrier injection. The operation of erasing electrons from the first through fourth sectors 250a~250d of the nonvolatile memory cell may be carried out in the unit of cell or cell block.

Then, a method of reading data from the first through fourth sectors 250a~250d of the nonvolatile memory cell will be described. According to conditions of data stored in the first and third sectors 250a and 250c, there are four available states of threshold voltage in turning the second channel region (i.e., a part adjacent to the first source/drain region 131a of the second channel region) between the first and second sectors 250a and 250b. That is, the nonvolatile memory cell is conditioned in a first state where the first and third sectors 250a and 250c all store electrons, a second state where there is no electron in both the first and third sectors 250a and 250c, a third state where only the first sector 250a stores electrons, or a fourth state where only the third sector 250c stores electrons. In the nonvolatile memory cell, the second channel region is partially variable with the four levels in threshold voltage, around the first source/drain region 131a, according to the first through fourth states. Specifically, the third state corresponds to a condition of changing a back bias to the nonvolatile memory cell while the fourth state corresponds to a condition that electrons are stored in the third sector 250c under the second gate electrode 126b. Thus, the third state is different from the fourth state in threshold voltage. Through first and second readout operations with respectively using first and second sensing voltages applied to the second gate electrode 126b in the condition that the first source/drain region 13 1a is being supplied with the ground voltage while the second source/drain region 131b is being supplied with the positive drain voltage, 2-bit data are read out from the first and third sectors 250a and 250c. During this, the positive drain voltage applied to the second source/drain region 131b causes the second channel region to be depleted around the second source/drain region 131b. Thus, it is able to detect data stored in the first and third sectors 250a and 250c without being affected from data stored in the second and fourth sectors 250b and 250d.

On the other hand, the nonvolatile memory cell using the first through fourth sectors 250a~250d as the data storage fields, according to conditions of data stored in the second and fourth sectors 250b and 250d, there are four available states of threshold voltage in turning the second channel region (i.e., a part adjacent to the second source/drain region 131b of the second channel region) between the first and second sectors 250a and 250b. In other words, the nonvolatile memory cell is conditioned in a fifth state where the second and fourth sectors 250b and 250d all store electrons, a sixth state where there is no electron in both the second and fourth sectors 250b and 250d, a seventh state where only the second sector 250b stores electrons, or an eighth state where only the fourth sector 250d stores electrons. In the nonvolatile memory cell, the second channel region is partially variable with the four levels in threshold voltage, around the second source/drain region 131b, according to the fifth through eighth states. Through third and/or fourth readout operations with respectively using third and fourth sensing voltages applied to the second gate electrode 126b in the condition that the first source/drain region 131a is being supplied with the positive drain voltage while the second source/drain region 131b is being supplied with the ground voltage, 2-bit data are read out from the second and fourth sectors 250b and 250d. The positive drain voltage applied to the first source/drain region 131a causes the second channel region to be depleted around the first source/drain region 131a. Thus, it is able to detect data stored in the second and fourth sectors 250b and 250d without being affected from data stored in the first and third sectors 250a and 250c.

From combining data bits held in the first and second sectors 250a and 250c with data bits held in the second and fourth sectors 250b and 250d, it offers 16 states to enable the nonvolatile memory cell to store 4-bit data therein. It is also permissible to read out 4-bit data from the nonvolatile memory cell by combining data obtained from the first and third sectors 250a and 250c with data obtained from the second and fourth sectors 250b and 250d.

Continuously referring to FIGS. 1, 2A, 2B, and 2C, on the third region c of the substrate 100, a lower insulation film 120c and a third active pattern 106c are stacked in sequence. The lower insulation film 120c fills a third empty region 116c between the substrate 100 of the third are C and the third active pattern 106c. The lower insulation film 120c provides the third active pattern 106c with tension to make atomic lattices expand in the third active pattern 106c. In this case, the lower insulation film 120c may include an insulation film that provides the third active pattern 106c with contactable tension thereto. For instance, the lower insulation film 120c may be formed with including a silicon nitride film that contacts to the bottom of the third active pattern 106c. Otherwise, the lower insulation film 120c may contain another insulation material. For example, the lower insulation film 120c may be further comprised of a third oxide film interposed between the third active pattern and the insulation film of tension, and a fourth oxide film interposed between the substrate 100 of the third region c and the insulation film of tension.

Third field isolation films 112c' fill third trenches 110c formed in the third region c of the substrate 100 around the third active pattern 106c, covering sidewalls of the third active pattern 106c and the lower insulation film 120c. Each of the third field isolation films 112c' is composed of first and second portions. The top of the first portion of the third field isolation film 112c' is leveled lower than the top of the lower insulation film 120c placed in the third empty region 116c. The top of the first portion of the third field isolation film 112c' may be leveled with or lower than the bottom of the third empty region 116c. The top of the second portion of the third field isolation film 112c' may be leveled with or higher than the third active pattern 106c. Thus, third recess regions 114c are defined in the third field isolation films 106c. The bottom of the third recess region 114c meets with the top of the first portion of the third field isolation film 112c', and a sidewall of the third recess region 114c includes a sidewall of the second portion of the third field isolation film 112c', and a sidewall of the third active pattern 106c adjacent to the first portion of the third field isolation film 112c'. The third field isolation film 112c' partially may be formed of silicon oxide.

The lower insulation film 120c partially extends to cover the bottom and sidewall of the third recess region 114c. On the extending portions of the lower insulation films 120c, third embedded patterns 122c are disposed to fill the third recess regions 114c. The top of the third embedded pattern 122c may be leveled with the top of the second portion of the third field isolation film 112c'. The third embedded pattern 122c may be made of silicon oxide.

A third gate electrode 126c crosses over the third active patterns 106c. Between the third gate electrode 126c and the third active pattern 106c is interposed a third gate insulation film 124c. At both sides of the third gate electrode 126c, third impurity layers 132 are formed in the third active pattern 106c. The third active pattern 106c between the third impurity layers 132 is defined as a third channel region. The third gate electrode 126c covers the third channel region. The third gate electrode 126c is made of a conductive material, for example, doped polysilicon, metal (e.g., tungsten or molybdenum), conductive metal nitride (e.g., titanium nitride or tantalum nitride), or metal silicide (e.g., tungsten silicide or cobalt silicide). The third gate insulation film 124c may be silicon oxide.

The field effect transistor is constructed with including the third gate electrode 126c, the third channel region, the couple of the third impurity layers 132 at both sides of the third channel region, and the third gate insulation film 124c. In operating the field effect transistor, a voltage applied to the third gate electrode 126c may be lower than the voltage applied to the first gate electrode 126a for the read operation.

When the lower insulation film 120c includes an insulation film that provides the third active pattern 106c with contactable tension thereto, atomic lattices of the third channel region expand by the lower insulation film 120c. Accordingly, the mobility of carriers flowing through the third channel region increases to enlarge the amount of turn-on current of the field effect transistor, which is advantageous to implementing a high-performance field effect transistor.

The dielectric film 120a, the multi-level insulation film 120b, and the lower insulation film 120c are formed in the same material. Namely, the first oxide film 201 of the dielectric film 120a, the first insulation film 211 of the multi-level insulation film 120b, and the third oxide film of the lower insulation film 120c are made of the same material. The high-k film 202 of the dielectric film 120a, the lower charge-trapping film 212 of the multi-level insulation film 120b, and the insulation film, which provides tension, of the lower insulation film 120c are made of the same material. The second oxide film 203 of the dielectric film 120a, the second insulation film 213 of the multi-level insulation film 120b, and a fourth oxide film of the lower insulation film 120c are also made of the same material.

According to the semiconductor device, the volatile memory cell of the first region a uses the first channel region as the data storage field. Thus, it minimizes step differences on the semiconductor device with a plurality of the volatile memory cell, making it easier to fabricate the semiconductor device. Further, since the volatile memory cell shares the pair of the impurity layers 130 with other volatile memory cells adjacent thereto at both sides thereof. Thereby, the volatile memory cell is able to be integrated in the area dimensions of $4F^2$. As a result, it is possible to offer a highly integrated semiconductor device. In addition, the substrate 100 under the first channel region is supplied with the voltage that provides attraction for the excessive charges to be stored in the first channel region, it improves the capability of data retention by the first channel region. And, as the dielectric film 120a interposed between the first channel region and the substrate of the first region a includes the high-k film 202 having a higher dielectric constant than silicon oxide, it is able to raise a ratio between a voltage, which is induced in the first channel region, and the voltage of attraction. As a result, the rate of power consumption is reduced in the semiconductor device.

In the nonvolatile memory cell of the second region b, data is stored in the lower charge-trapping film 212 under the second channel region. Specifically, as the first and second sectors 250a and 250b of the lower charge-trapping film 212 are used as the data storage fields, the nonvolatile memory cell acts as a multi-bit cell capable of storing 2-bit data. Additionally, the nonvolatile memory cell may include the upper charge-trapping film 222 on the second channel region. Thus, it is permissible to store data bits in the lower and upper charge-trapping films 212 and 222, implementing a highly integrated nonvolatile memory cell capable of storing more two data bits. Moreover, the first and second source/drain regions 131a and 13 1b belonging to the nonvolatile memory cell are shared by adjacent nonvolatile memory cells adjacent thereto. According to this, the nonvolatile memory cell is able to be fabricated in the a real dimensions of $4F^2$, implementing a highly integrated semiconductor device.

With the highly integrated volatile and nonvolatile memory cell as aforementioned and illustrated, the semiconductor device is operable in high-performance and multi-functional modes including a volatile cell array composed of the volatile memory cells, and a nonvolatile cell array composed of the nonvolatile memory cells in the same substrate.

On the other hand, a semiconductor device according to another embodiment of the invention may be configured to be a volatile memory device including a volatile cell array composed of the volatile memory cells that are formed in the first region a. Further, a semiconductor device according to another embodiment of the invention may be configured to be a nonvolatile memory device including a nonvolatile cell array composed of the nonvolatile memory cells that are formed in the second region b. Also, the volatile memory device according to another embodiment may include the high-performance field effect transistors of the third region c in the substrate. The nonvolatile memory device according to another embodiment may also include the high-performance field effect transistors of the third region c in the substrate.

Now, the procedure of fabricating the semiconductor device in accordance with the present invention will be described.

FIGS. 4A through 8A are sectional views illustrating processing steps for fabricating the semiconductor device by the embodiment of the invention, taken along lines I-I', II-II', and III-III' of FIG. 1, and FIGS. 4B through 8B are sectional views illustrating processing steps for fabricating the semiconductor device by the embodiment of the invention, taken along lines IV-IV', V-V', and VI-VI' of FIG. 1. FIGS. 4C through 8C are sectional views illustrating processing steps for fabricating the semiconductor device by the embodiment of the invention, taken along lines VII-VII', VIII-VIII', and IX-IX' of FIG. 1.

Figure 4A:
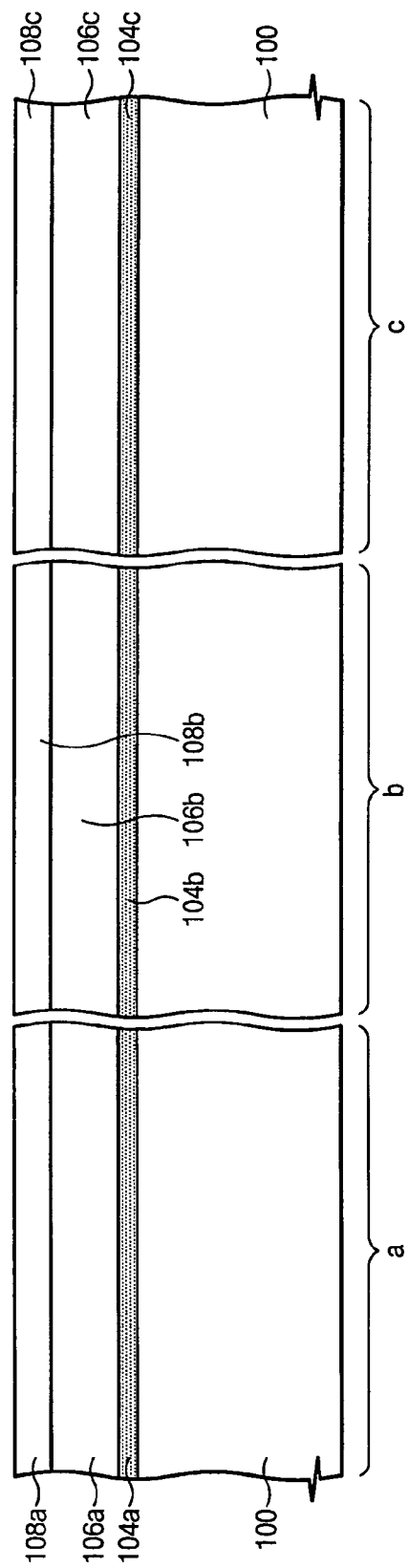
Figure 4B:
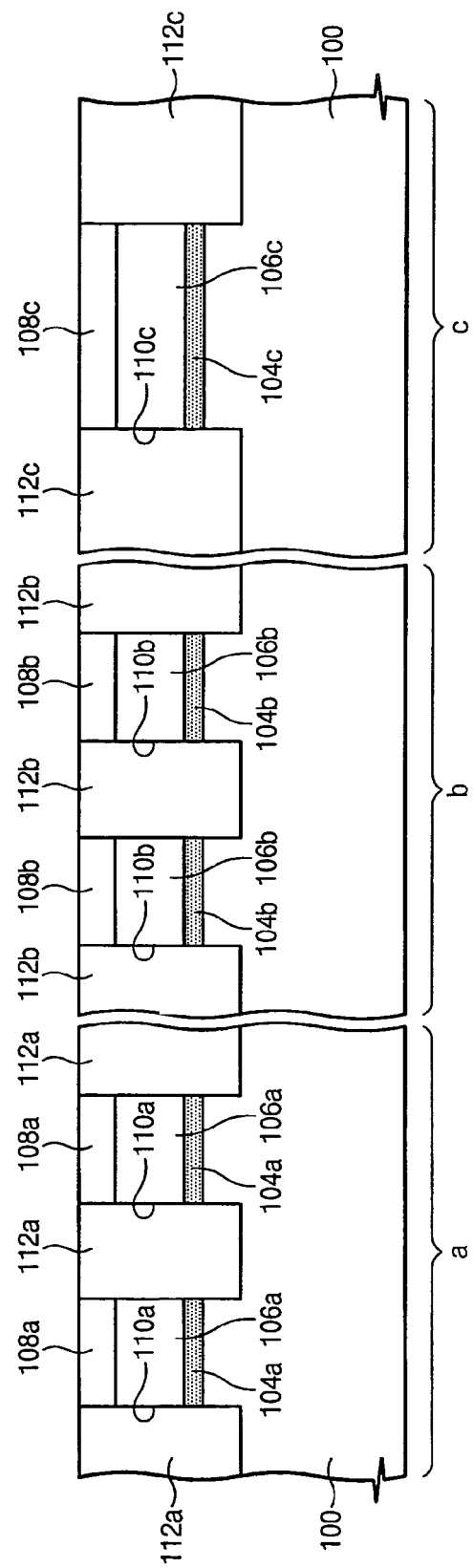
FIGS. 4B, 5B, 6B, 7B and 8B are sectional views illustrating processing steps for fabricating the semiconductor device according to an embodiment of the invention, taken along lines IV-IV', V-V', and VI-VI' of FIG. 1.
Figure 4C:
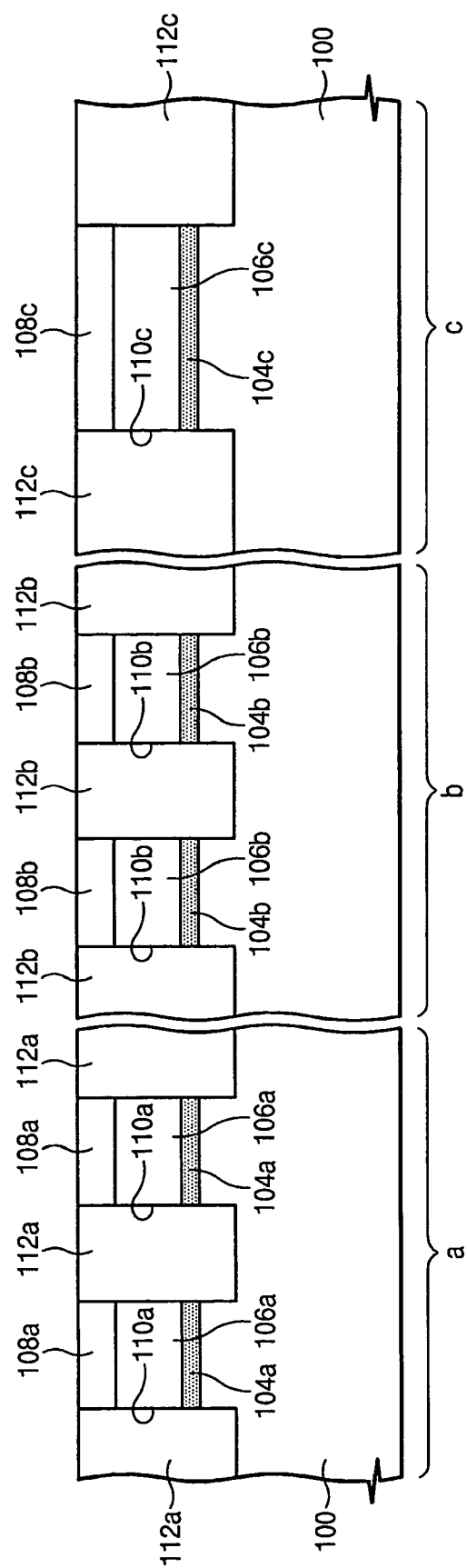

First, referring to FIGS. 4A, 4B, and 4C, the substrate 100 including the first, second, and third regions a, b, and c is prepared. Different or same wells may be formed in the first, second, and third regions a, b, and c of the substrate 100. The substrate 100 is preferred to be formed of single crystalline silicon.

Sacrificial and active layers are sequentially formed all over the substrate 100. The sacrificial layer is formed of a material having etching selectivity to the active layer and the substrate 100. The sacrificial layer is preferred to be formed of a semiconductor. The sacrificial layer is preferred to be formed by means of a first epitaxial process, using silicon and germanium source gases, on the substrate 100. Thus, the sacrificial layer is made of a silicon-germanium layer. The active layer is preferred to be formed by means of a second epitaxial process, using silicon source gas, on the sacrificial layer. Thus, the active layer is made of a single crystalline silicon layer.

First, second, and third hard mask patterns 108a, 108b, and 108c are formed on the active layers of the first, second, and third regions a, b, and c, respectively. The first hard mask patterns 108a may be arranged in parallel with a predetermined interval on the active layer of the first region a. The second hard mask patterns 108b may be arranged in parallel with a predetermined interval on the active layer of the second region b. The first, second, and third hard mask patterns 108a, 108b, and 108c are preferred to be formed including a material that has etching selectivity to the active layer, the sacrificial layer, and the substrate 100. For instance, the hard mask patterns 108a, 108b, and 108c may be made of silicon nitride.

Using the first, second, and third hard mask patterns 108a, 108b, and 108c as a mask, the active layer, the sacrificial layer, and the substrate 100 are patterned to form first trench 110a defining first active region of the first region a, second trench 110b defining second active region of the second region b, and third trench 10c defining third active region of the third region c. During this, first sacrificial pattern 104a and first active pattern 106a are formed stacked in sequence on the first active region, while second sacrificial pattern 104b and second active pattern 106b are formed stacked in sequence on the second active region. The third sacrificial pattern 104c and third active pattern 106c are formed with being stacked in sequence in the third active region.

After depositing a field-isolating insulation film to fill the first, second, and third trenches 110a, 110b, and 110c all over the substrate 100, the field-isolating insulation film is patterned until exposing the first through third hard mask patterns 108a~108c, resulting in the first, second, third field isolation films 112a, 112b, and 112c to each fill the first, second, and third trenches 110a, 110b, and 110c.

Figure 5B:
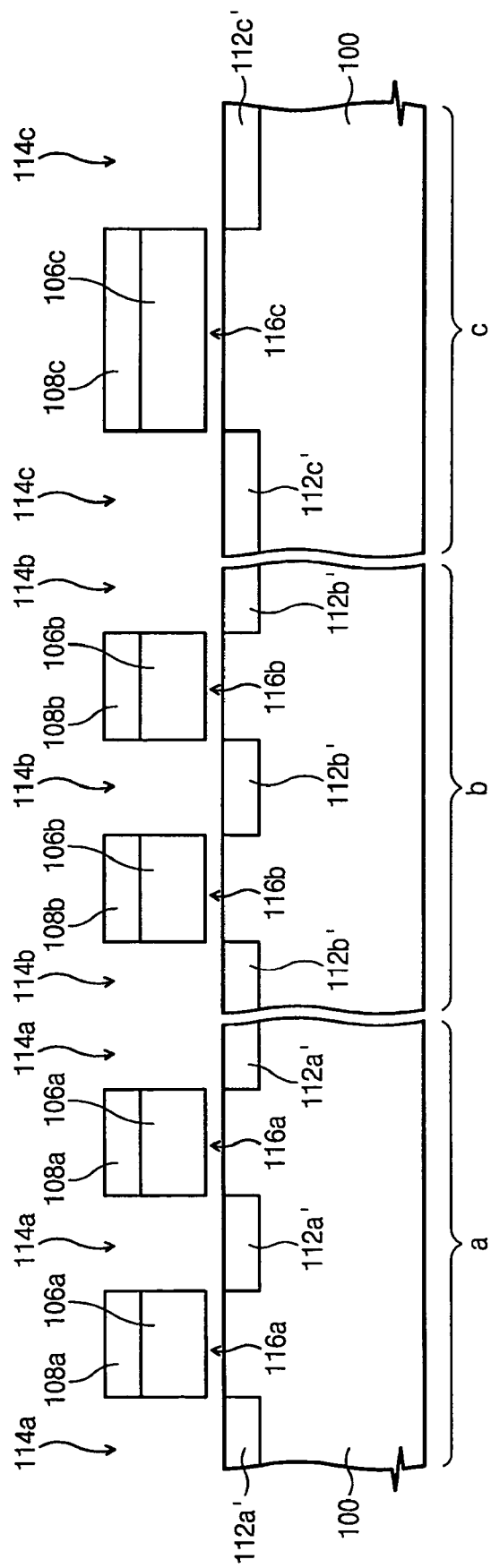
Figure 5C:
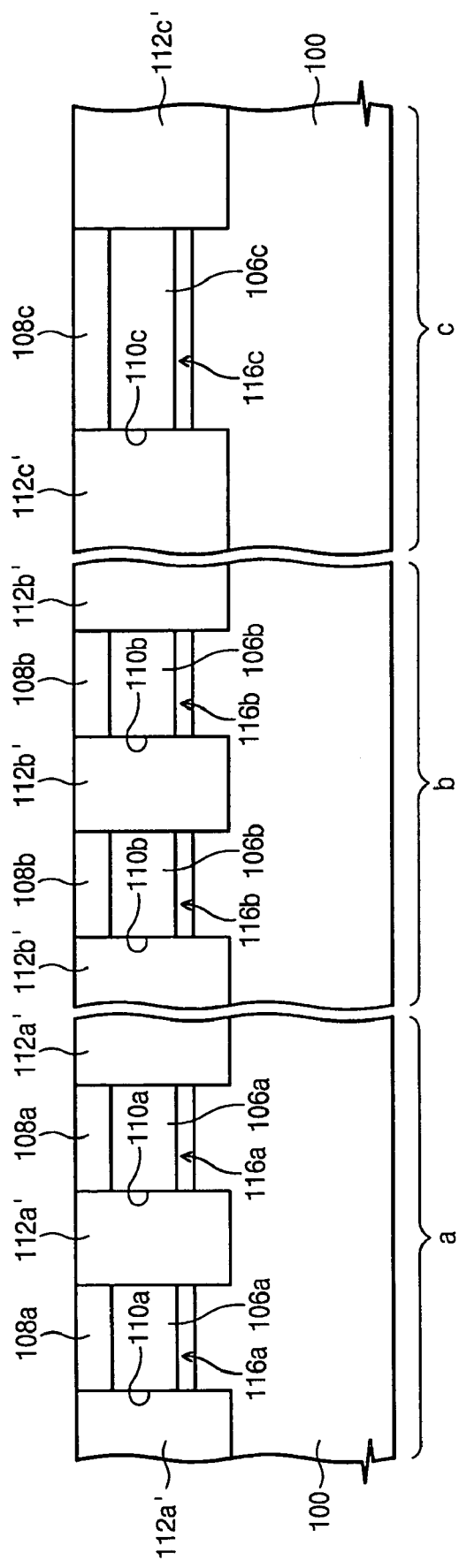

Next, referring to FIGS. 5A, 5B, and 5C, the first field isolation films 112a are partially removed to form the first recess regions 114a to partially expose sidewalls of the first sacrificial and active patterns 104a and 106a. The bottoms of the first recess regions 114a are lower than the tops of the first sacrificial patterns 104a. Specifically, the bottoms of the first recess regions 114a may be leveled with or lower than the bottoms of the first sacrificial patterns 104a. Each of the first field isolation films 112a' associated with the first recess regions 114a is composed of the first and second portions. The tops of the second portions of the first field isolation films 112a' may be leveled with the tops of the first hard mask patterns 108a. That is, the bottoms of the first field isolation films 112a' constitute the bottoms of the first recess regions 114a, without covering the sidewalls of the first active patterns. The second portions of the first field isolation films 112a' partially cover the sidewalls of the second active patterns 106a, contacting thereto.

The second field isolation films 112b are partially removed to form the second recess regions 114b to partially expose sidewalls of the second sacrificial and active patterns 104b and 106b. The bottoms of the second recess regions 114b are lower than the tops of the second sacrificial patterns 104b. Specifically, the bottoms of the second recess regions 114b may be leveled with or lower than the bottoms of the second sacrificial patterns 104b. As similar to the first field isolation films 112a', the first portions of the second field isolation films 112b' having the second recess regions 114b do not partially cover the sidewalls of the second active patterns 106b, but the second portions of the second field isolation films 112b' partially cover the sidewalls of the second active patterns 106b.

The third field isolation films 112c are partially removed to form the third recess regions 114c to partially expose sidewalls of the third sacrificial and active patterns 104c and 106c.

The bottoms of the third recess regions 114c are lower than the tops of the third sacrificial patterns 104c. Specifically, the bottoms of the third recess regions 114c may be leveled with or lower than the bottoms of the third sacrificial patterns 104c. As similar to the first field isolation films 112a', the first portions of the third field isolation films 112b' having the third recess regions 114c do not partially cover the sidewalls of the third active patterns 106c, but the second portions of the third field isolation films 112c' partially cover the sidewalls of the third active patterns 106c.

The first through third recess regions 114a~114c may be formed at the same time.

A selective isotropic etching process is carried out to remove the first through third sacrificial patterns 104a~104c each exposed by the first through third sacrificial patterns 104a~104c. Thereby, the first empty regions 116a are formed between the first active patterns 106a and the first region a of the substrate 100. The second empty regions 116b are formed between the second active patterns 106b and the second region b of the substrate 100, and the third empty regions 116c are formed between the third active patterns 106c and the third region c of the substrate 100. During this, the second portions of the first field isolation films 112a' contact with the sidewalls of the first active patterns 106a, physically supporting first active patterns 106a. As also, the second portions of the second and third field isolation films 112b' and 112c' physically support the second and third active patterns 106b and 106c.

Figure 6B:
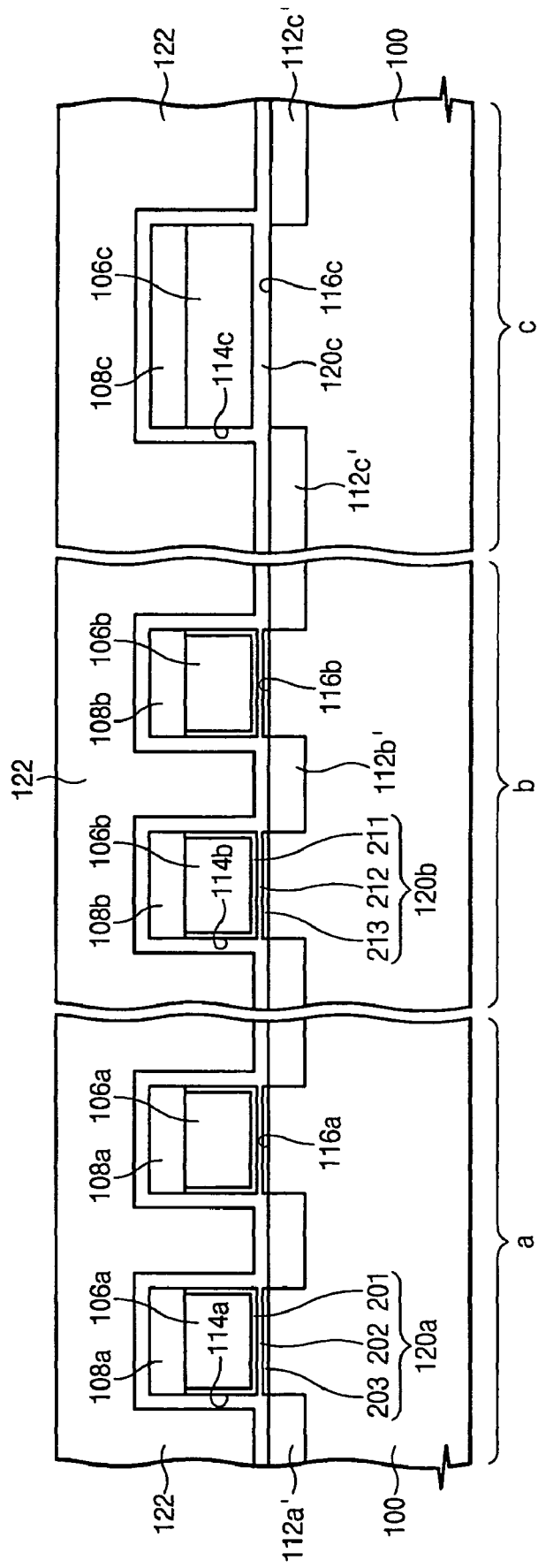

Next, referring to FIGS. 6A, 6B, and 6C, the dielectric films 120a are formed to fill the first empty regions 116a in the first region a. The multi-level insulation films 120b are formed to fill the second empty regions 115b in the second region b. The lower insulation films 120c are formed to fill the third empty regions 115c in the third region c.

Each dielectric film 116a includes the high-k film 202 having a higher dielectric constant than a silicon oxide film. The dielectric film 120a may be further comprised of the first oxide film 201 interposed between the high-k film 202 and the first empty region 116a, and the second oxide film 203 interposed between the high-k film 202 and the substrate that is the bottom of the first empty region 116a. Each of the multi-level insulation films 120b is comprised of the lower charge-trapping film 212, the first insulation film 211 interposed between the lower charge-trapping film 212 and the second active pattern 106b, and the second insulation film 213 interposed between the lower charge-trapping film 212 and the substrate 100 that is the bottom of the second empty region 116b. Each of the lower insulation films 120c may include the insulation film that directly contacts with the third active pattern 106c to provide tension thereto. Otherwise, the lower insulation film 120c may include the third oxide film interposed placed under the third active pattern, and the fourth oxide film formed on the bottom of the third empty region 116c, and the insulation film that provides tension with filling the third empty region 116c between the third and fourth oxide films. The dielectric films 120a, the multi-level insulation films 120b, and the lower insulation films 120b may be made of the same material. The dielectric films 120a, the multi-level insulation films 120b, and the lower insulation films 120b may also include different insulation materials from each other.

Hereinafter the procedure of fabrication when the dielectric films 120a, the multi-level insulation films 120b, and the lower insulation films 120c include different insulation materials from each other will be described. First, a first oxidation process is carried out to deposit the first and second oxide films 201 and 203 on the tops and bottoms of the first empty regions 116a. The first oxide films 201 may be deposited even on the sidewalls of the first active patterns 106a exposed in the first recess regions 114a. After then, the high-k films 202 are conformably formed all over the substrate 100, filling the first empty regions 116a between the first and second oxide films 201 and 203. The high-k films 202 are conformably formed even on the bottoms and sidewalls of the first recess regions 114a. The same materials with the first and second oxide films 201 and 203, and the high-k films 202 are selectively from the second and third regions b and c of the substrate 100 to form the second and third empty regions 116b and 116c.

Thereafter, a second oxidation process is conducted to deposit the first and second insulation films 211 and 213 on the bottoms and bottoms of the second empty regions 116b. The first insulation films 211 may be formed even on the sidewalls of the second active patterns 106b exposed by the second recess regions 211. The lower charge-trapping are conformably formed all over the substrate 100, filling the second empty regions 116b between the first and second insulation films 211 and 213. The lower charge-trapping films 212 are conformably formed even on the bottoms and sidewalls of the second recess regions 114b.

The lower charge-trapping films 212 are selectively removed from the first and third regions a and c of the substrate 100, and the same material with the first and second insulation films 211 and 213 are removed from the third region c of the substrate 100. Thereby, it results in the third empty regions 116c.

The lower insulation film 120c is deposited to fill the third empty regions 116c. The lower insulation film 120c may be completed by forming the insulation film, which provides contactable tension to the bottoms of the third active patterns 106c, in the condition with the third empty regions 116c. Otherwise, the lower insulation film 120c may be completed by, after depositing the third and fourth oxide films on the tops and bottoms of the third empty regions 116c by way of a third oxidation process, forming the insulation films of tension to fill the third empty regions 116c between the third and fourth oxide films. The insulation film of tension is conformably formed even on the bottoms and sidewalls of the third recess regions 114c. It is able to selectively remove the same material with the insulation film of tension from the first and second regions A and B of the substrate 100.

Next, the procedure of fabrication when the dielectric films 120a, the multi-level insulation films 120b, and the lower insulation films 120c include the same material will be described. First, an oxidation process is carried out to deposit the first and second oxide films 201 and 203 each on the tops and bottoms of the first empty regions 116a, the first and second insulation films 211 and 213 on the tops and bottoms of the second empty regions 116b, and the third and fourth oxide films each on the tops and bottoms of the third empty regions 116c.

The material films are conformably formed to fill the first empty regions 116a between the first and second oxide films 201 and 203, the second empty regions 116b between the first and second insulation films 211 and 213, and the third empty regions 116c between the third and fourth oxide films. The material films filing the first, second, and third empty regions 116a, 116b, and 116c are correspondent with the high-k dielectric film 202, the lower charge-trapping film 212, and the insulation film of tension, respectively. The material films are conformably formed even on the sidewalls and bottoms of the first through third recess regions 114a~114c.

Referring to FIGS. 6A, 6B, and 6C, an embedded film 122 is formed all over the substrate 100, filling the first through third recess regions 114a~114c. The embedded film 122 may be made of silicon oxide.

Figure 7B:
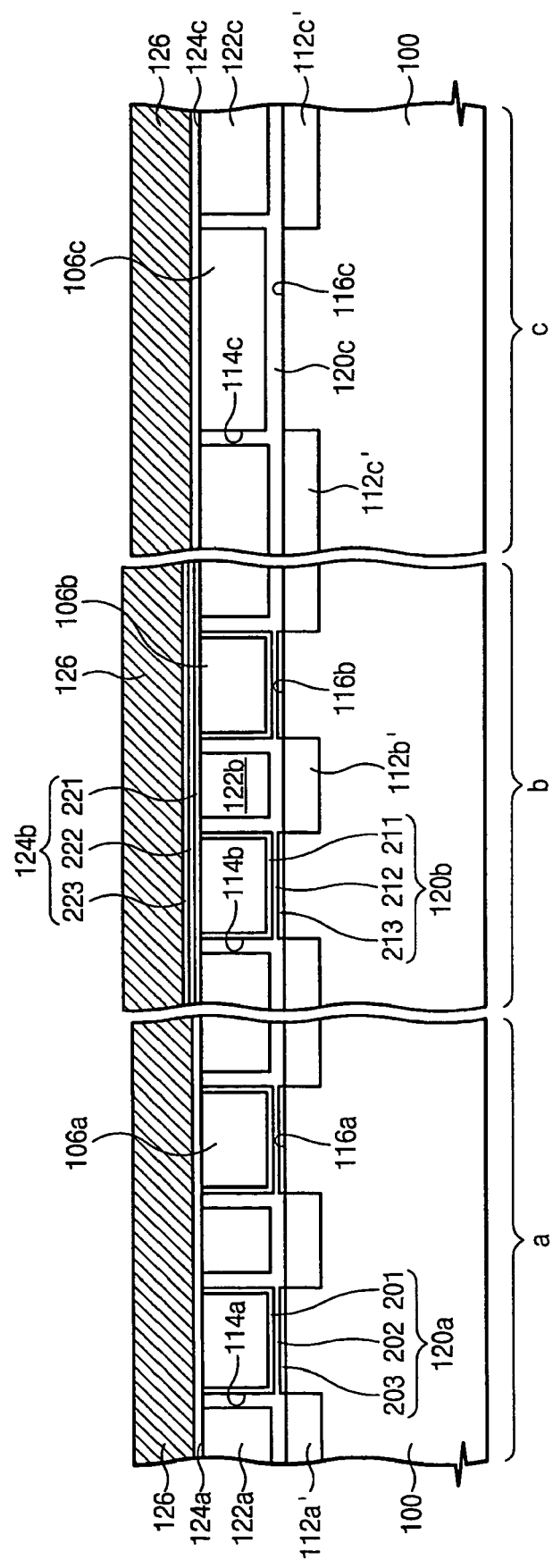
Figure 7C:
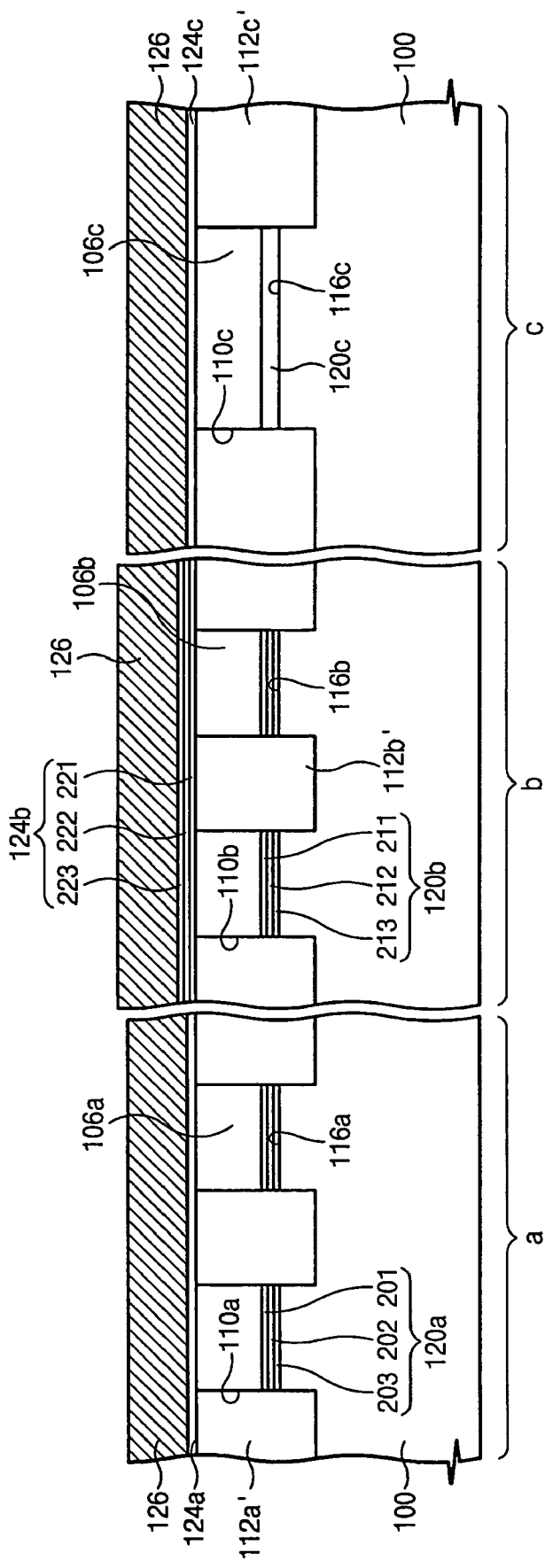

Then, referring to FIGS. 7A, 7B, and 7C, the embedded film 122, the high-k film 202, the lower charge-trapping film 212, and the lower insulation film 120c are partially flattened until exposing the hard mask patterns 108a, 108b, and 108c. This planarization process results in the first, second, and third embedded patterns 122a, 122b, and 122c filling the first, second, and third recess regions 114a, 114b, and 114c.

Thereafter, the hard mask patterns 108a, 108b, and 108c are removed therefrom to expose the tops of the first, second, and third active patterns 106a, 106b, and 106c. Before removing the hard mask patterns 108a~108c, it is permissible to further conduct a processing step of recessing the tops of the field isolation films 112a'~112c' and the embedded patterns 122a~122c. Thus, after removing the hard mask patterns 108a~108c, the tops of the field isolation films 112a'~112c' and the embedded patterns 122a~122c may be leveled almost with the tops of the active patterns 106a~106c.

The first, second, and third gate insulation films, 124a, 124b, and 124c, are selectively formed on the first, second, and third active patterns 106a, 106b, and 106c, respectively. Each of the second gate insulation films 124c may be made up with a single insulation layer. In this case, the first through third gate insulation films 124a~124c may be formed of silicon oxide, specifically, thermal oxide. The first through third gate insulation films 124a~124c may be also different in thickness by means of selective thermal oxidation.

Otherwise, the second gate insulation film 124b may include the tunnel insulation film 221, and the upper charge-trapping film 222, and the blocking insulation film 223 those are stacked thereon in sequence. In this case, the procedure is carried out as follows. The second gate insulation film 124b is deposited all over the substrate 100. After selectively removing the second gate insulation film 124b from the first and third regions a and b of the substrate 100, the first and third gate insulation films 124a and 124c are formed respectively on the first and third active patterns 106a and 106c. Here, a process of selective thermal oxidation may be carried out to form the first and third insulation films 124a and 124c in different thickness.

A conductive gate film 126 is deposited all over the substrate 100. The conductive gate film 126 may be formed of a single layer with a conductive material such as doped polysilicon, metal (e.g., tungsten or molybdenum), conductive metal nitride (e.g., titanium nitride or tantalum nitride), or metal silicide (e.g., tungsten silicide or cobalt silicide), or a composite of them.

Figure 8B:
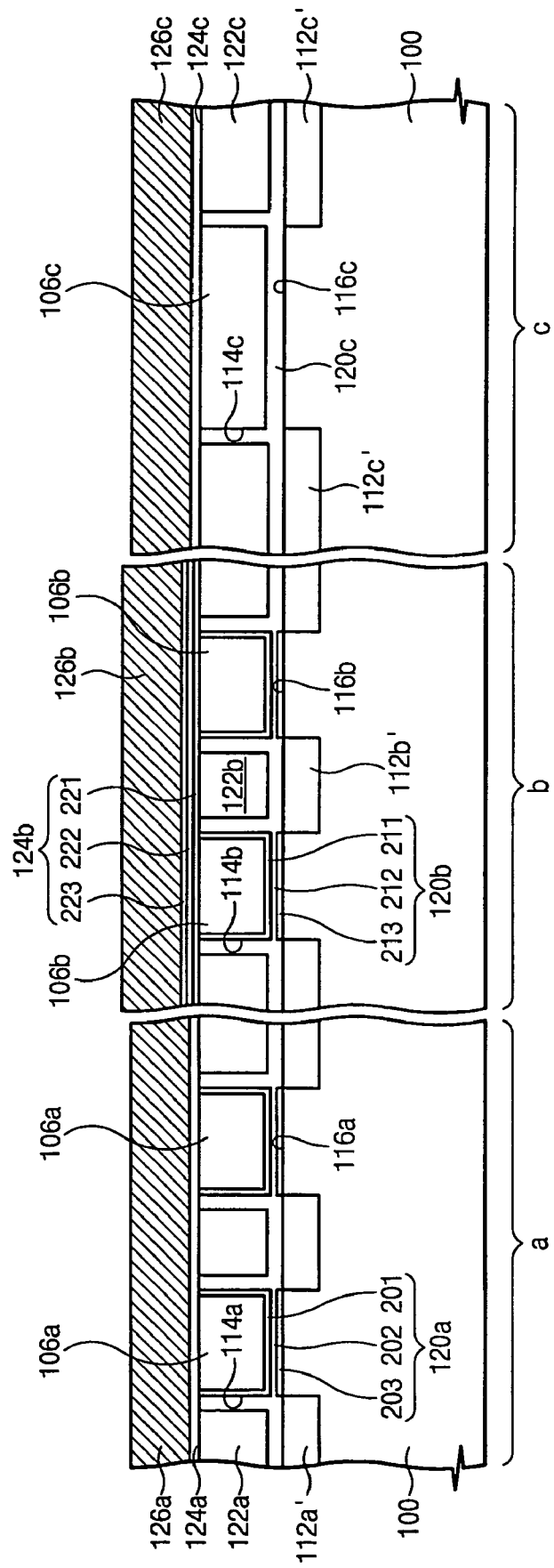

Referring to FIGS. 8A, 8B, and 8C, the conductive gate film 126 of the first region a is patterned to form the first gate electrodes 126a intersecting the first active patterns 106a. The conductive gate film 126 of the second region b is patterned to form the second gate electrodes 126b intersecting the second active patterns 106b. The conductive gate film 126 of the third region c is patterned to form the third gate electrodes 126c intersecting the third active patterns 106c. The first, second, and third gate electrodes, 126a, 126b, and 126c, may be formed at one time.

Subsequently, the first impurity layers 130, the second impurity layers 131a and 131b, and the third impurity layers 132 are formed in the first active patterns 106a at both sides of the first gate electrodes 126a, the second active patterns 106b at both sides of the second gate electrodes 126b, and the third active patterns 106c at both sides of the third gate electrodes 126c, respectively. The first, second, and third impurity layers, 130, 131a and 131b, and 132, may be formed in sequence or at the same time. Thereby, the semiconductor device shown in FIGS. 1, 2A, 2B, and 2C is completed.

The invention may offer a method of fabricating a volatile memory device in the first region a of the substrate 100, as well as a method of fabricating a nonvolatile memory device in the second region b of the substrate 100.

As stated above, the invention provides the structures capable of disposing such insulation films with various functions between the active patterns and the substrate. Therefore, it is possible to provide volatile memory cells suitable for higher integration and having improved data retention capability, nonvolatile memory cells suitable for higher integration and storing multi-bit data, and/or field effect transistors with higher performance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a dielectric film and an active pattern that are stacked in sequence on a substrate;
   a gate electrode crossing over the active pattern;
   a gate insulation film interposed between the gate electrode and the active pattern;
   a pair of impurity layers formed in the active pattern at both sides of the gate electrode, respectively, and defining a channel region in the active pattern under the gate electrode, the bottoms of the impurity layers contacting with the top of the dielectric film; and
   a field isolation film filling a trench formed in the substrate around the active pattern and covering sidewalls of the dielectric film and the active pattern,
   wherein excessive charges are stored in the channel region, such that the channel region is a data storage field of a volatile memory cell and the substrate is supplied with a voltage to provide attraction for the excessive charges stored in the channel region,
   wherein the top of the field isolation film is partially leveled lower than the top of the dielectric film and forms the bottom of a recess region, a sidewall of the recess region partially including a sidewall of the active pattern, and
   wherein the dielectric film partially extends along the bottom and sidewall of the recess region.

2. The semiconductor device as set forth in claim 1, which further comprises: an embedded pattern disposed on the extending portion of the dielectric film, filling the recess region.

3. The semiconductor device as set forth in claim 1, wherein the excessive charges are of the same polarity as majority carriers of the channel region.

4. The semiconductor device as set forth in claim 1, wherein the dielectric film includes an insulation material higher than silicon oxide in dielectric constant.

5. A semiconductor device comprising:
   a multi-level insulation film and an active pattern being stacked on a substrate in sequence, the multi-level insulation film including a lower charge-trapping film;
   a gate electrode crossing over the active pattern;
   a gate insulation film interposed between the gate electrode and the active pattern;
   a pair of impurity layers formed in the active pattern at both sides of the gate electrode, respectively, and defining a channel region under the gate electrode, the bottoms of the impurity layers contacting with the top of the multi-level insulation film; and
   a field isolation film filling a trench formed in the substrate around the active pattern and covering sidewalls of the multi-level insulation film and the active pattern,
   wherein the top of the field isolation film is partially leveled lower than the top of the multi-level insulation film and forms the bottom of a recess region, a sidewall of the recess region partially including a sidewall of the active pattern,
   wherein the multi-level insulation film partially extends along the bottom and sidewall of the recess region.

6. The semiconductor device as set forth in claim 5, wherein the gate insulation film is formed of a single layer of insulation material.

7. The semiconductor device as set forth in claim 5, wherein the gate insulation film includes a tunnel insulation film, an upper charge-trapping film, and a blocking insulation film, which are stacked in sequence.

8. The semiconductor device as set forth in claim 5, wherein the multi-level insulation film further comprises: a first insulation film interposed between the lower charge-trapping film and the active pattern; and a second insulation film interposed between the lower charge-trapping film and the substrate.

9. The semiconductor device as set forth in claim 5, which further comprises: an embedded pattern disposed on the extending portion of the multi-level insulation film, filling the recess region.

10. A semiconductor device comprising:
    a substrate including a first region and a second region;
    a dielectric film and a first active pattern stacked in sequence on the substrate of the first region, and a multi-level insulation film and a second active pattern stacked in sequence on the substrate of the second region, the multi-level insulation film including a lower charge-trapping film;
    first and second gate electrodes crossing over the first and second active patterns, respectively;
    first and second gate insulation films interposed between the first gate electrode and the first active pattern, and between the second gate electrode and the second active pattern, respectively;
    a pair of first impurity layers formed in the first active pattern at both sides of the first gate electrode, respectively, and defining a first channel region in the first active region under the first gate electrode, the bottoms of the first impurity layers contacting with the top of the dielectric film;
    a pair of second impurity layers formed in the second active pattern at both sides of the second gate electrode, respectively, and defining a second channel region in the second active region under the second gate electrode, the bottoms of the second impurity layers contacting with the top of the multi-level insulation film;
    a first field isolation film filling a first trench formed in the substrate of the first region around the first active pattern and covering sidewalls of the dielectric film and the first active pattern; and
    a second field isolation film filling a second trench formed in the substrate of the second region around the second active pattern and covering sidewalls of the multi-level insulation film and the second active pattern,
    wherein the first channel region is used as a data storage field of a volatile memory cell,
    wherein the top of the first field isolation film is partially leveled lower than the top of the dielectric film and forms the bottom of a first recess region, a sidewall of the first recess region partially including a sidewall of the first active pattern, and the dielectric film partially extends along the bottom and sidewall of the first recess region, and wherein the top of the second field isolation film is partially leveled lower than the top of the multi-level insulation film and forms the bottom of a second recess region, a sidewall of the second recess region partially including a sidewall of the second active pattern, and the multi-level insulation film partially extends along the bottom and sidewall of the second recess region.

11. The semiconductor device as set forth in claim 10, wherein the substrate of the first region is supplied with a voltage to provide attraction for excessive charges stored in the first channel region, the excessive charges being of the same polarity as majority carriers of the first channel region.

12. The semiconductor device as set forth in claim 10, wherein the second gate insulation film is formed of a single layer of insulation material.

13. The semiconductor device as set forth in claim 10, wherein the second gate insulation film includes a tunnel insulation film, an upper charge-trapping film, and a blocking insulation film, which are stacked in sequence.

14. The semiconductor device as set forth in claim 10, wherein the dielectric film and the multi-level insulation film are made of the same material.

15. The semiconductor device as set forth in claim 10, which further comprises:

a first embedded pattern disposed on the extending portion of the dielectric film, filling the first recess region; and a second embedded pattern disposed on the extending portion of the multi-level insulation film, filling the second recess region.

16. The semiconductor device as set forth in claim 10, wherein the substrate further includes a third region, which further comprises:

a third active pattern and a lower insulation film stacked in sequence on the substrate of the third region;

a third gate electrode crossing over the third active pattern;

a third gate insulation film interposed between the third gate electrode and the third active pattern; and a pair of third impurity layers formed in the third active pattern at both sides of the third gate electrode, respectively.

17. The semiconductor device as set forth in claim 16, which further comprises: a third field isolation film filling a third trench formed in the substrate of the third region around the third active pattern and covering sidewalls of the lower insulation film and the third active pattern, wherein the top of the third field isolation film is partially leveled lower than the top of the lower insulation film and forms the bottom of a third recess region, a sidewall of the third recess region partially including a sidewall of the third active pattern, wherein the lower insulation film partially extends along the bottom and sidewall of the third recess region.

18. The semiconductor device as set forth in claim 17, which further comprises: a third embedded pattern disposed on the extending portion of the lower insulation film, filling the third recess region.

* * * * *